(12) United States Patent
Eckel

(10) Patent No.: US 10,944,207 B2
(45) Date of Patent: Mar. 9, 2021

(54) ELECTRICAL CONNECTOR WITH HEAT BRIDGE AND ELECTRICAL CONNECTION ARRANGEMENT COMPRISING AN ELECTRICAL CONNECTOR WITH HEAT BRIDGE

(71) Applicant: TE Connectivity Germany GmbH, Bensheim (DE)

(72) Inventor: Markus Eckel, Buerstadt (DE)

(73) Assignee: TE Connectivity Germany GmbH, Bensheim (DE)

( * ) Notice: Subject to any disclaimer, the term of this patent is extended or adjusted under 35 U.S.C. 154(b) by 119 days.

(21) Appl. No.: 15/933,572

(22) Filed: Mar. 23, 2018

(65) Prior Publication Data

US 2018/0277986 A1   Sep. 27, 2018

(30) Foreign Application Priority Data

Mar. 23, 2017  (DE) .................... 10 2017 204 939.1

(51) Int. Cl.
| | |
|---|---|
| *H01R 13/533* | (2006.01) |
| *H01R 13/05* | (2006.01) |
| *H01R 9/16* | (2006.01) |
| *H05K 7/20* | (2006.01) |
| *H01R 13/53* | (2006.01) |
| *H01R 13/504* | (2006.01) |

(52) U.S. Cl.
CPC .............. *H01R 13/533* (2013.01); *H01R 9/16* (2013.01); *H01R 13/055* (2013.01); *H05K 7/2039* (2013.01); *H01R 13/504* (2013.01); *H01R 13/53* (2013.01); *H01R 2201/26* (2013.01)

(58) Field of Classification Search
CPC ..................................................... H01R 13/533
USPC ................................................ 439/485, 487
See application file for complete search history.

(56) References Cited

U.S. PATENT DOCUMENTS

| | | | | |
|---|---|---|---|---|
| 3,636,496 A | * | 1/1972 | Jenkins ................. | H01B 9/001 439/502 |
| 4,082,407 A | * | 4/1978 | Smorzaniuk .......... | H01R 23/68 361/709 |
| 4,464,005 A | * | 8/1984 | Dwight ................. | H01R 12/75 439/485 |

(Continued)

FOREIGN PATENT DOCUMENTS

| | | |
|---|---|---|
| CN | 102082348 A | 6/2011 |
| CN | 102474043 A | 5/2012 |

(Continued)

OTHER PUBLICATIONS

European Patent Office Communication, dated Jan. 30, 2020, 6 pages.

(Continued)

*Primary Examiner* — Neil Abrams
(74) *Attorney, Agent, or Firm* — Barley Snyder

(57) ABSTRACT

An electrical connector comprises a housing, an electrical contact disposed in the housing, and a heat bridge. The heat bridge has a heat absorption surface thermally connected to the electrical contact and a heat transfer surface accessible from outside the electrical connector and electrically insulated from the electrical contact. An insulating layer may be deposited onto the heat bridge. An abrasion protection part may be used to protect the insulating layer.

20 Claims, 29 Drawing Sheets

(56) References Cited

U.S. PATENT DOCUMENTS

| | | | | |
|---|---|---|---|---|
| 4,780,799 | A * | 10/1988 | Groh | F21V 19/0005 362/293 |
| 5,263,874 | A * | 11/1993 | Miller | F21V 19/0005 362/294 |
| 6,282,092 | B1 * | 8/2001 | Okamoto | H01L 23/142 165/80.3 |
| 6,602,091 | B2 * | 8/2003 | Belady | H01R 13/533 361/704 |
| 6,736,668 | B1 * | 5/2004 | Kholodenko | H01R 13/533 439/485 |
| 6,785,139 | B2 * | 8/2004 | Onizuka | H05K 7/026 165/185 |
| 7,128,604 | B2 * | 10/2006 | Hall | H01R 24/542 439/578 |
| 8,123,573 | B2 | 2/2012 | Takehara et al. | |
| 8,587,946 | B2 * | 11/2013 | Lee | H05K 7/1431 361/713 |
| 8,641,444 | B2 | 2/2014 | Yoshida et al. | |
| 8,926,360 | B2 * | 1/2015 | Manahan | H01R 13/46 439/485 |
| 9,017,093 | B1 * | 4/2015 | Packard, III | H02B 1/03 439/487 |
| 10,033,141 | B2 * | 7/2018 | Creusen | H01R 24/62 |
| 2011/0143580 | A1 | 6/2011 | Lee | |
| 2017/0186572 | A1 | 6/2017 | Kato et al. | |
| 2018/0277986 | A1 * | 9/2018 | Eckel | H01R 9/16 |

FOREIGN PATENT DOCUMENTS

| | | |
|---|---|---|
| DE | 10 2007 055 320 B3 | 3/2009 |
| DE | 10 2007 055235 B3 | 6/2009 |
| DE | 10 2012 216694 A1 | 3/2014 |
| DE | 10 2015 016 267 A1 | 7/2016 |
| GB | 2119179 A | 11/1983 |
| JP | 2000208177 A | 7/2000 |
| JP | 2003292703 A | 10/2003 |
| WO | 2016052089 A1 | 4/2016 |
| WO | 2016060123 A1 | 4/2016 |

OTHER PUBLICATIONS

Abstract of DE102012216694, dated Mar. 20, 2014, 1 page.
Chinese Office Action and English translation, dated Sep. 21, 2020, 17 pages.
Abstract of JP 2003292703A, dated Oct. 15, 2003, 1 page.
Abstract of WO 2016052089, dated Apr. 7, 2016, 2 pages.

* cited by examiner

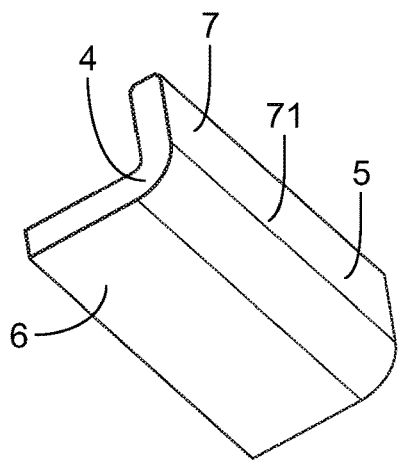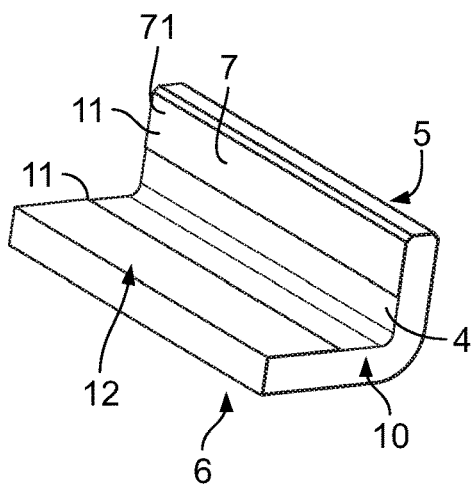
Fig. 4A        Fig. 4B
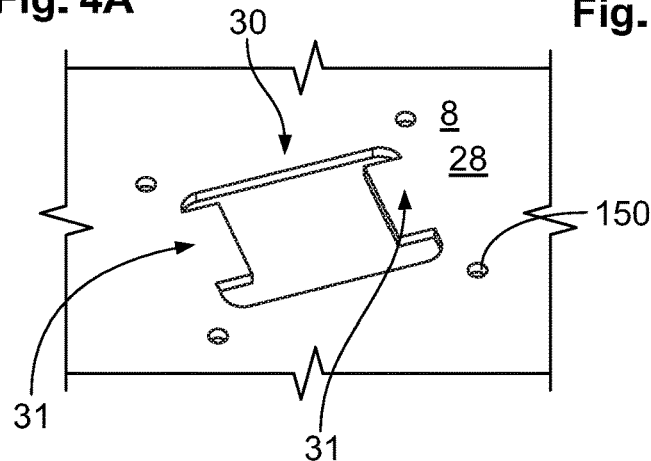
Fig. 5
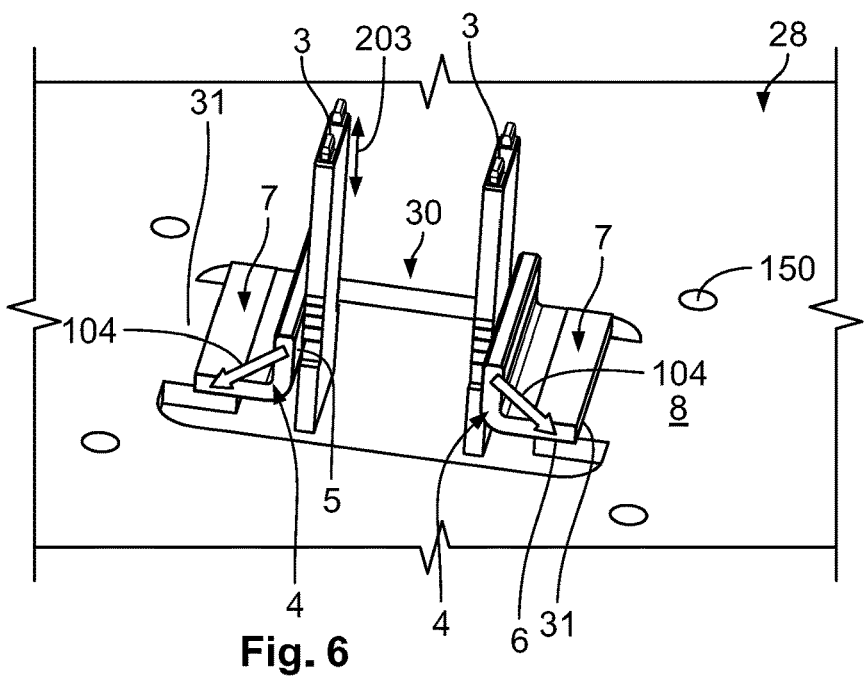
Fig. 6

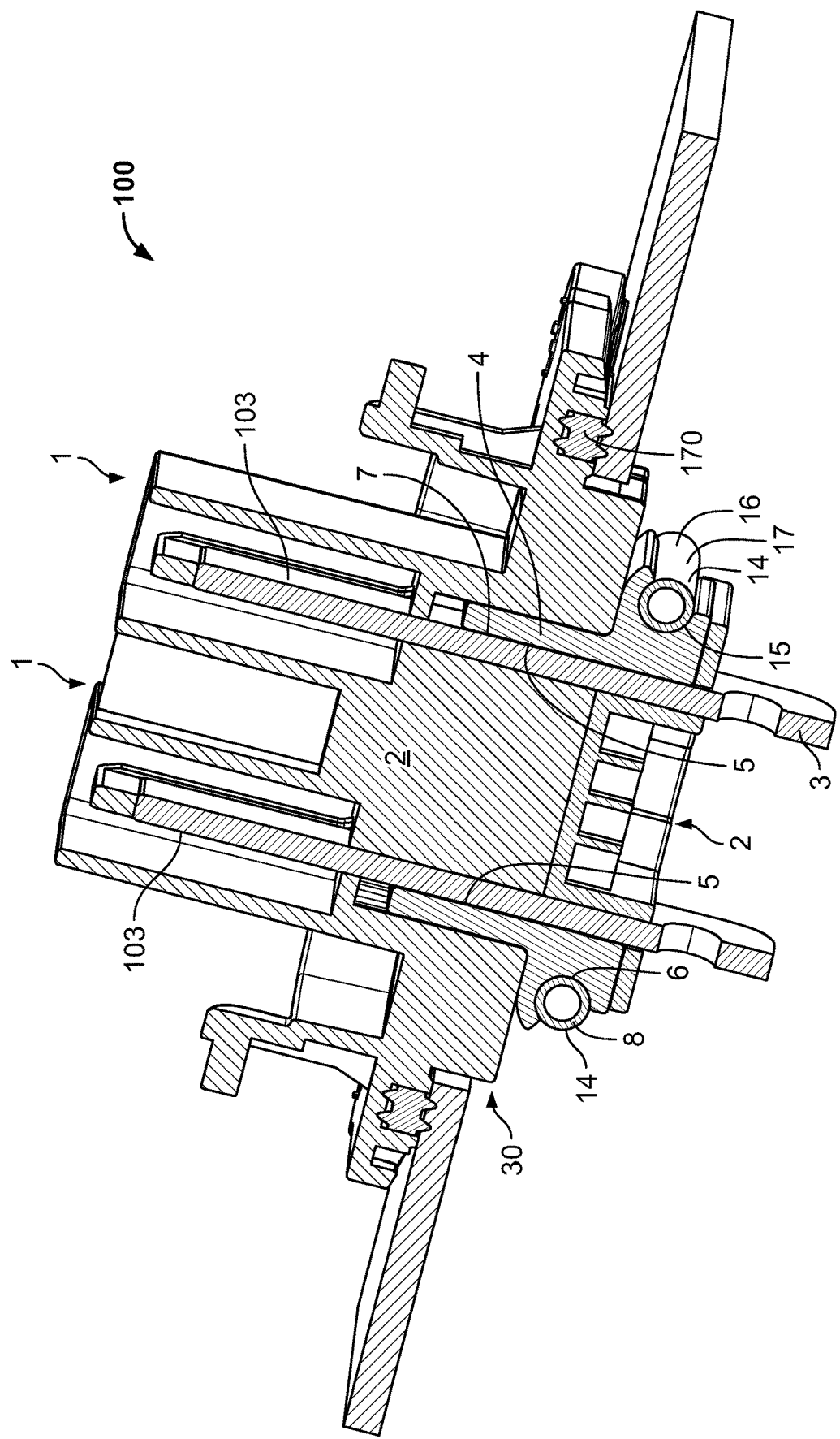

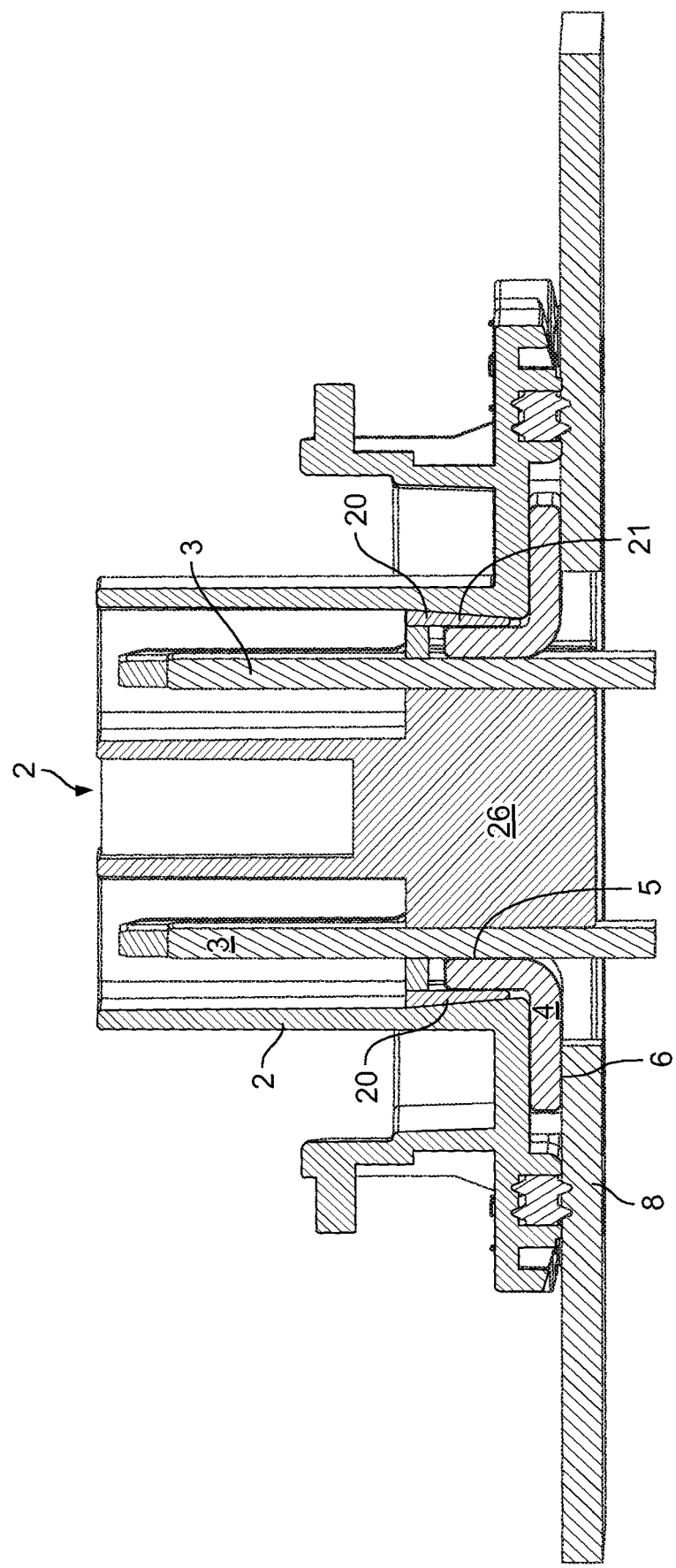

US 10,944,207 B2

ELECTRICAL CONNECTOR WITH HEAT BRIDGE AND ELECTRICAL CONNECTION ARRANGEMENT COMPRISING AN ELECTRICAL CONNECTOR WITH HEAT BRIDGE

CROSS-REFERENCE TO RELATED APPLICATION

This application claims the benefit of the filing date under 35 U.S.C. § 119(a)-(d) of German Patent Application No. 102017204939.1, filed on Mar. 23, 2017.

FIELD OF THE INVENTION

The present invention relates to an electrical connector and, more particularly, to an electrical connector having an electrical contact disposed in a housing.

BACKGROUND

Electrical connectors are used to transmit electrical power in a variety of applications. Connectors used for transmitting greater quantities of electrical power, such as in electric vehicle applications, generally have larger physical dimensions. Large connectors, however, are not desirable due to the limited space available for the connector.

SUMMARY

An electrical connector comprises a housing, an electrical contact disposed in the housing, and a heat bridge. The heat bridge has a heat absorption surface thermally connected to the electrical contact and a heat transfer surface accessible from outside the electrical connector and electrically insulated from the electrical contact.

BRIEF DESCRIPTION OF THE DRAWINGS

The invention will now be described by way of example with reference to the accompanying Figures, of which:

FIG. 4A is a bottom perspective view of a heat bridge of the electrical connector of FIG. 1;
FIG. 4B is a top perspective view of the heat bridge;
FIG. 5 is a perspective view of a heat sink of the electrical connector of FIG. 1;
FIG. 6 is a perspective view of the heat bridge, the heat sink, and contacts of the electrical connector of FIG. 1;
FIG. 13 is a sectional view of an electrical connector according to a fourth embodiment;
FIG. 18 is a sectional view of an electrical connector according to a sixth embodiment.

DETAILED DESCRIPTION OF THE EMBODIMENT(S)

Figure 1:
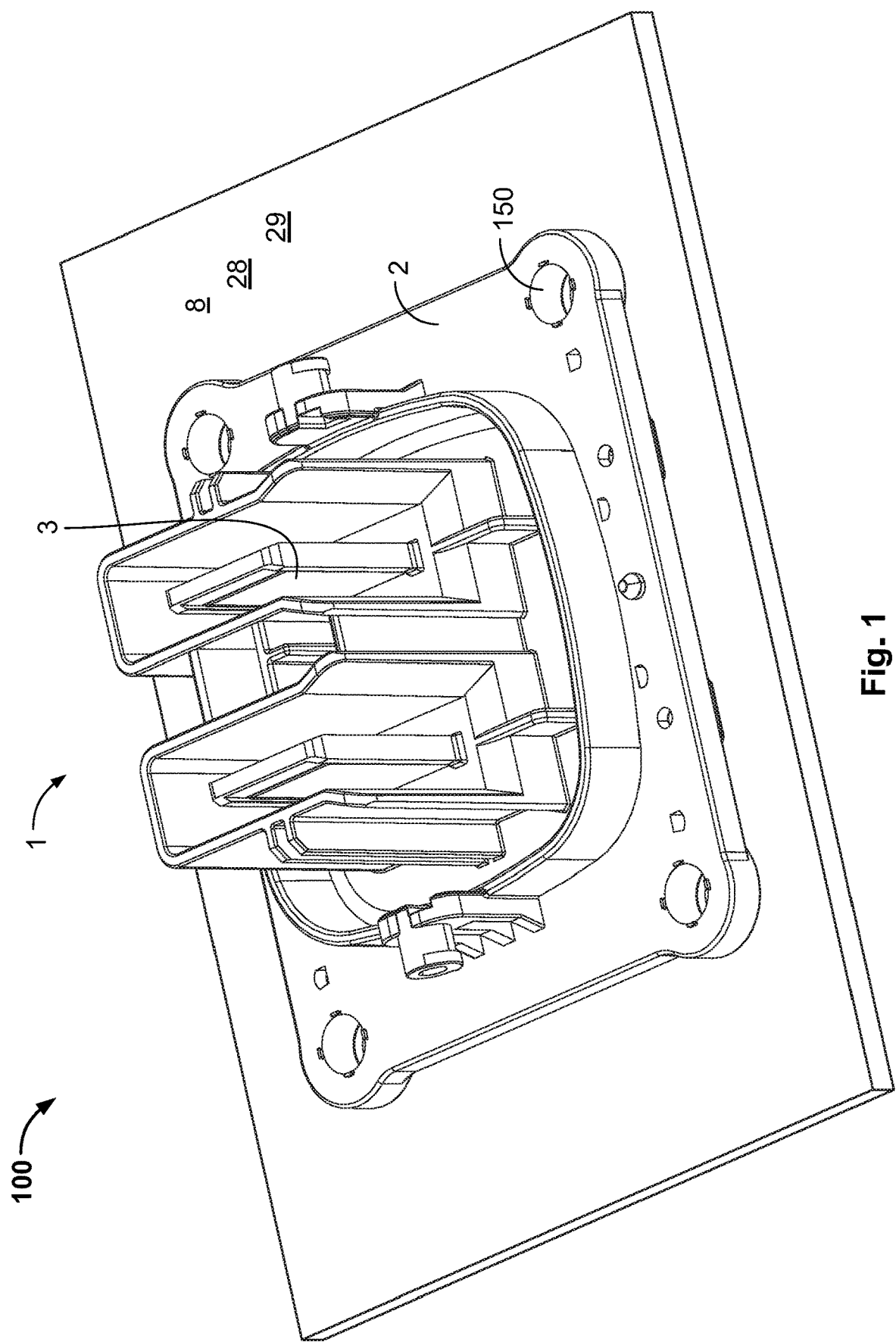
FIG. 1 is a perspective view of an electrical connector according to a first embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

An electrical connector 1 according to a first embodiment is shown in FIGS. 1-6. The electrical connector 1 is attached to a unit housing 28. In an embodiment, the unit housing 28 is an electrical unit of a vehicle. Currents are transmitted into the interior of the unit housing 28 or out of the unit housing 28 via the connector 1.

The connector 1 includes electrical contacts 3 disposed in a housing 2. The electrical contact 3 are capable of being connected to corresponding mating contacts of a mating plug. During transmission of electrical power, the electrical contacts 3 first heat up by virtue of the internal resistance of the contacts 3. Second, heating occurs in the region of points of connection 103, shown in FIG. 2, at which the contacts 3 are in contact with the mating contacts. The maximum heat permitted limits the power transmission.

In order to cool a contact 3 or to dissipate the heat present therein, the connector 1 has a heat bridge 4 shown in FIGS. 2, 3, 4, and 6. The heat bridge 4 is connected to the contact 3 at a heat absorption surface 5. The heat bridge 4 lies planarly on the contact 3 at the heat absorption surface 5 in order to be able to transfer as great an amount of heat as possible as quickly as possible. The heat received at the heat bridge 4 is then emitted in the region of a heat transfer surface 6 to a heat sink 8.

An electrical assembly 100 shown in FIG. 1 includes the connector 1 and the heat sink 8 attached to the connector 1. In the shown embodiment, the heat sink 8 is the unit housing 28. The unit housing 28 emits the heat to the environment. A passive cooling thus arises, without movable parts and without further assistance. If the connector 1 is not attached to the unit housing 28, then the heat transfer surface 6 is accessible from the outside.

The heat bridge 4 is formed from a material which possesses a good thermal conductivity. In an embodiment, the heat bridge 4 is formed of copper. The heat bridge 4 is also an electrically conductive material, for instance a metal, and in order to reduce the manufacturing complexity, the heat bridge 4 can comprise a material which is also used for the electrical contact 3. In other embodiments, the heat bridge 4 can consist of a material which is electrically insulating but which has good thermal conductivity.

In order to enable a good heat transfer, the heat absorption surface 5 and/or the heat transfer surface 6 form a large portion of the surface of the heat bridge 4, for example at least 10%, at least 20%, 30% or 40% of the surface in various embodiments. The thermal connection path between the heat absorption surface 5 and the heat transfer surface 6 should be as short as possible. The distance between the heat transfer surface 6 and the heat absorption surface 5 can, for example, be less than 50% of the length of the heat bridge 4, or in other embodiments, may be 30%, 20%, 10% or less of the length of the heat bridge 4.

Figure 2:
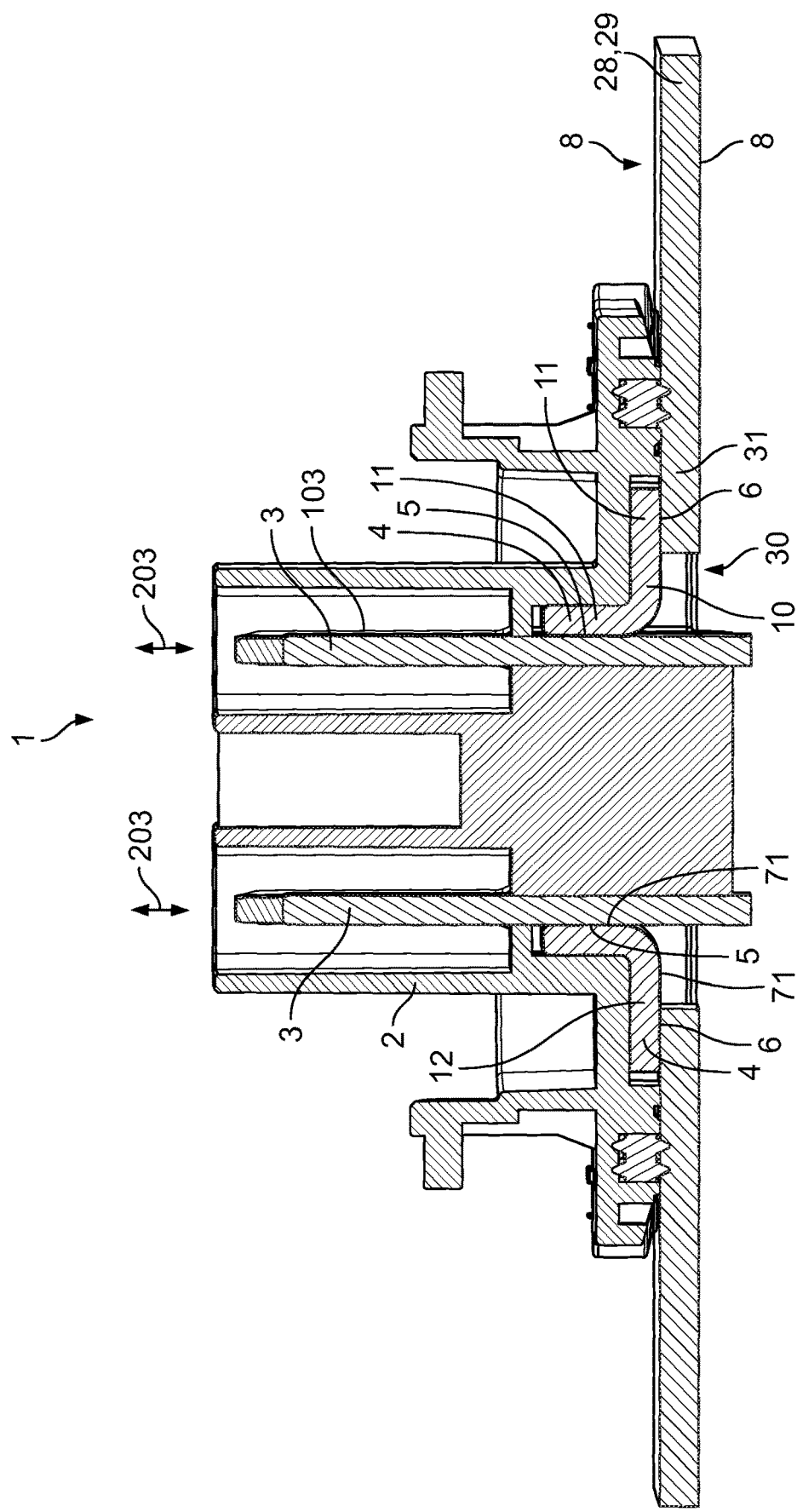
FIG. 2 is a sectional view of the electrical connector of FIG. 1.

The heat absorption surface 5 is disposed near the point of connection 103, as shown in FIG. 2. In an embodiment, no further element is arranged between the heat absorption surface 5, or the part of the heat bridge 4 which comprises the heat absorption surface 5, and the point of connection 103. In another embodiment, only a small housing element which is necessary for the electrical insulation or for sealing is disposed between the point of connection 103 and the heat absorption surface 5. The distance between the point of connection 103 and the heat absorption surface 5 can be, in various embodiments, less than 30%, less than 20%, or less than 10% of the length of the electrical contact 3.

In order to avoid producing an electrical connection between the contact 3 and the heat sink 8, the heat transfer surface 6 is electrically insulated from the contact 3. The heat bridge 4, as shown in FIGS. 4A, 4B, and 6, has an electrically insulating layer 7. In the shown embodiment, the electrically insulating layer 7 is a foil 71 which has good thermal conductivity and is simultaneously electrically insulating. The electrically insulating layer 7, as shown in FIGS. 4A, 4B, and 6, almost completely covers an outer side of the heat bridge 4; the electrically insulating layer 7 is arranged in both the region of the heat absorption surface 5 and in the region of the heat transfer surface 6, forming a double protection against electrical contact. In other embodiments, instead of a foil 71, the electrically insulating layer 7 can be produced by coating, spraying, immersion or similar methods. Other elements can also be used as an electrically insulating layer 7 to ensure the electrical insulation, for example thin and/or planar heat-conducting elements, such as thermally conductive rubber or thermopads.

Figure 3:
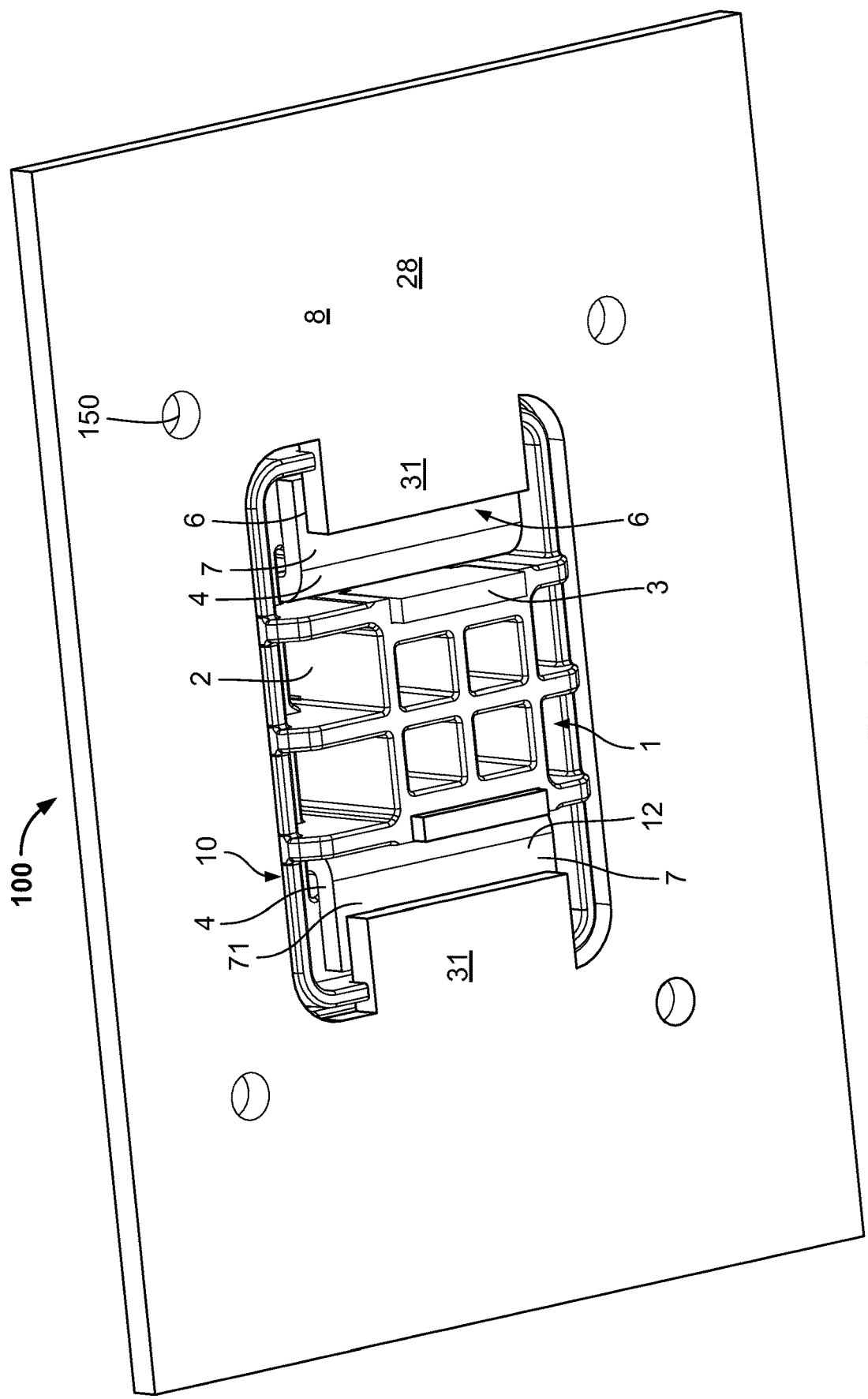
FIG. 3 is a bottom view of the electrical connector of FIG. 1.

The unit housing 28, as shown in FIGS. 3 and 5, has heat contact tongues 31 which protrude into a receptacle 30 for the connector 1. The heat contact tongues 31 couple the heat bridge 4 to the heat sink 8 in the form of the unit housing 28. The contact tongues 31 each project perpendicular to a longitudinal direction 203 of the electrical contacts 3 into the recess 30.

A heat flow 104, which goes out of the contacts 3 via the heat bridges 4 into the heat sink 8, is schematically indicated in FIG. 6. The heat bridge 4 has an L-shape 10 as shown in FIG. 4B. The heat absorption surface 5 runs perpendicular to the heat transfer surface 6, the surfaces each being arranged at one of two limbs 11 of the L-shape 10. By virtue of such a perpendicular configuration, the heat absorption surface 5 and the heat transfer surface 6 can each be connected planarly to the contact 3 and the heat sink 8 respectively, permitting a compact configuration. The heat bridge 4 is a part 12 of an extruded profile and can have been produced, for example, by simple separation from the extruded profile. In various embodiments, the foil 71 can already be present on the extruded profile or can be added later after the separation.

As shown in FIGS. 1, 3, and 6, by attaching screws 151 in holes 150 of a housing 2 of the connector 1 and holed 150 of the unit housing 28, the connector 1 can be pressed onto the unit housing 28 to form a good thermal contact between the heat transfer surface 6 and the contact tongue 31.

Figure 7:
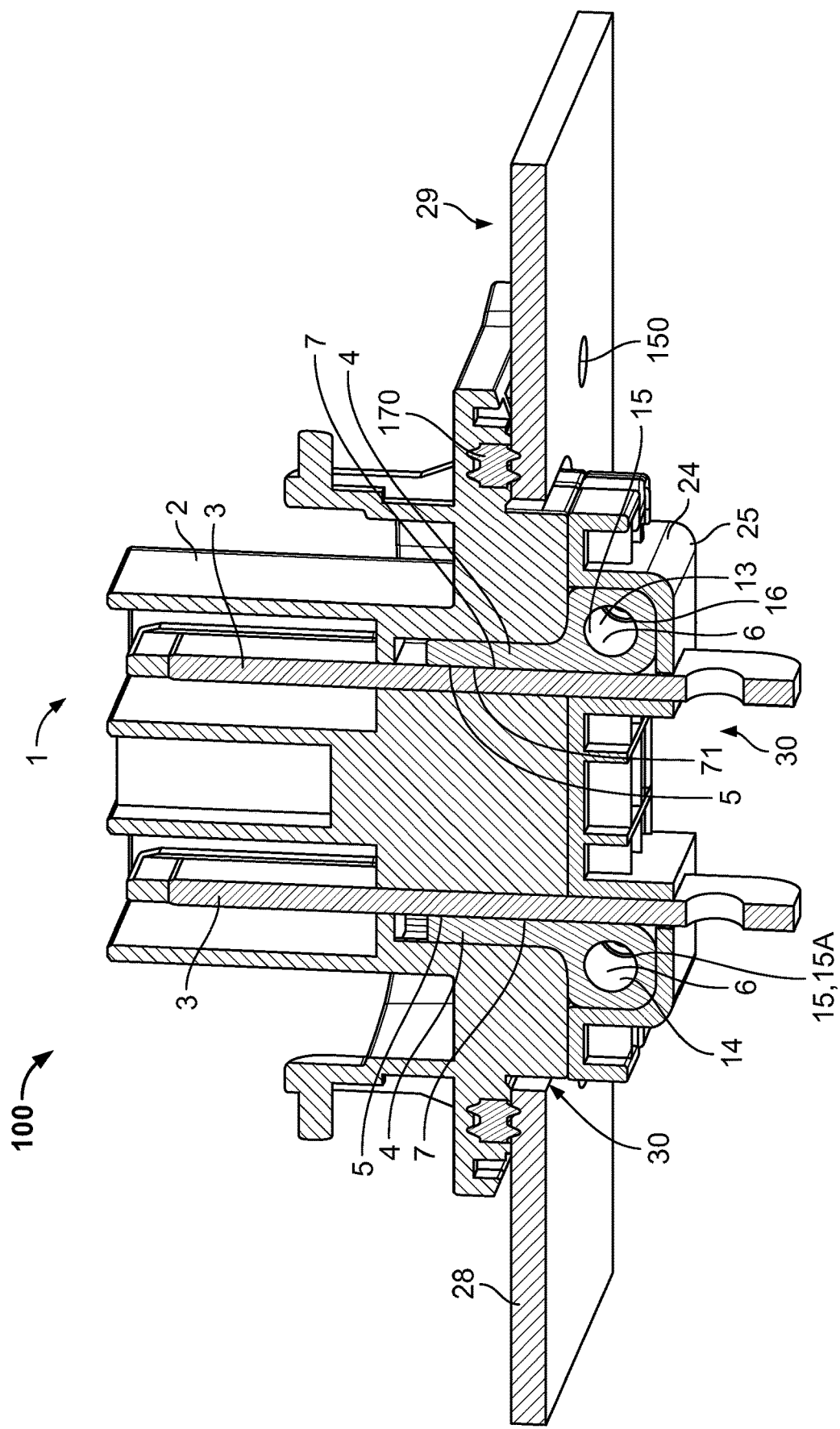
FIG. 7 is a sectional view of an electrical connector according to a second embodiment.
Figure 8:
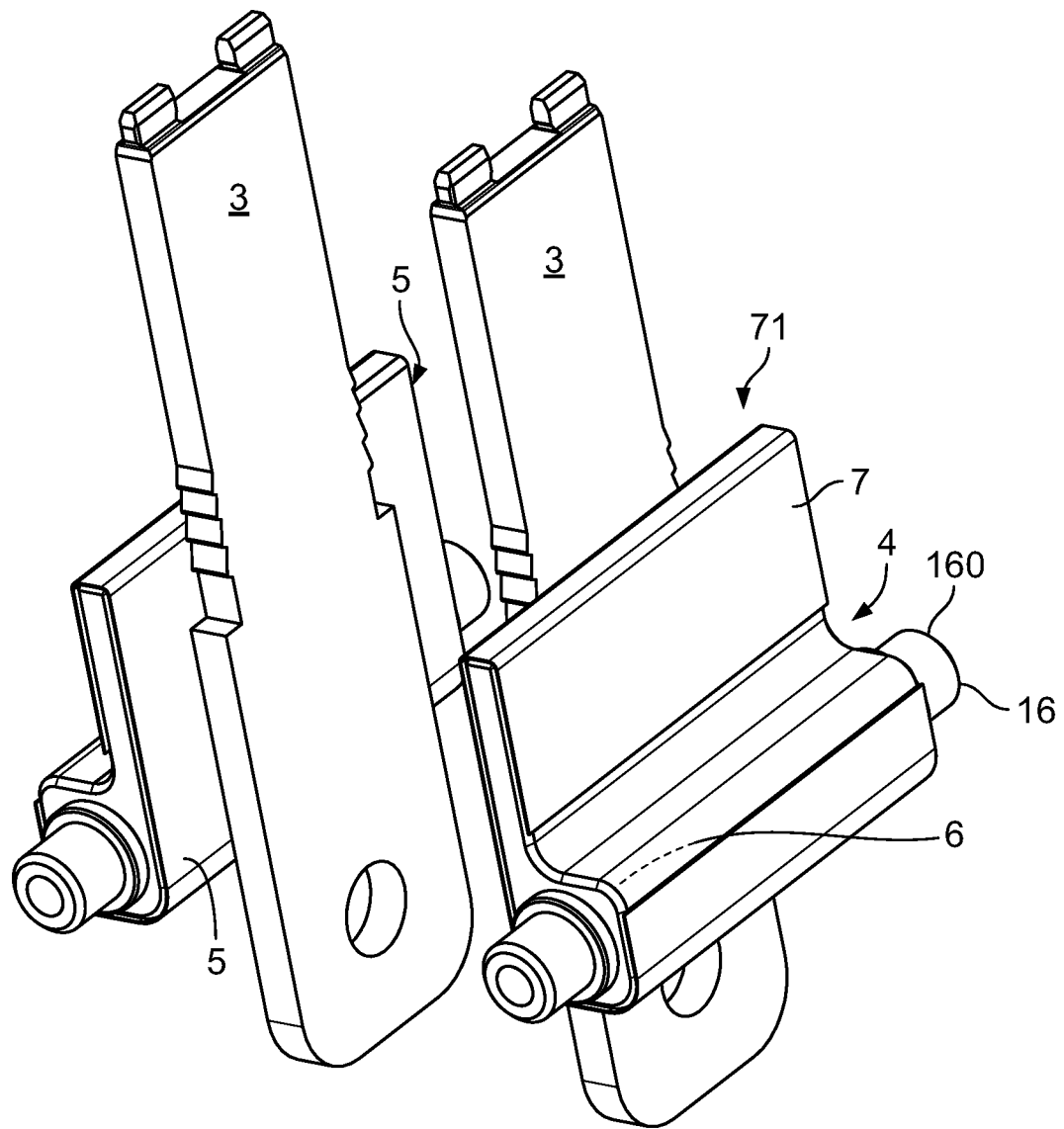
FIG. 8 is a perspective view of a heat bridge and contacts of the electrical connector of FIG. 7.
Figure 9:
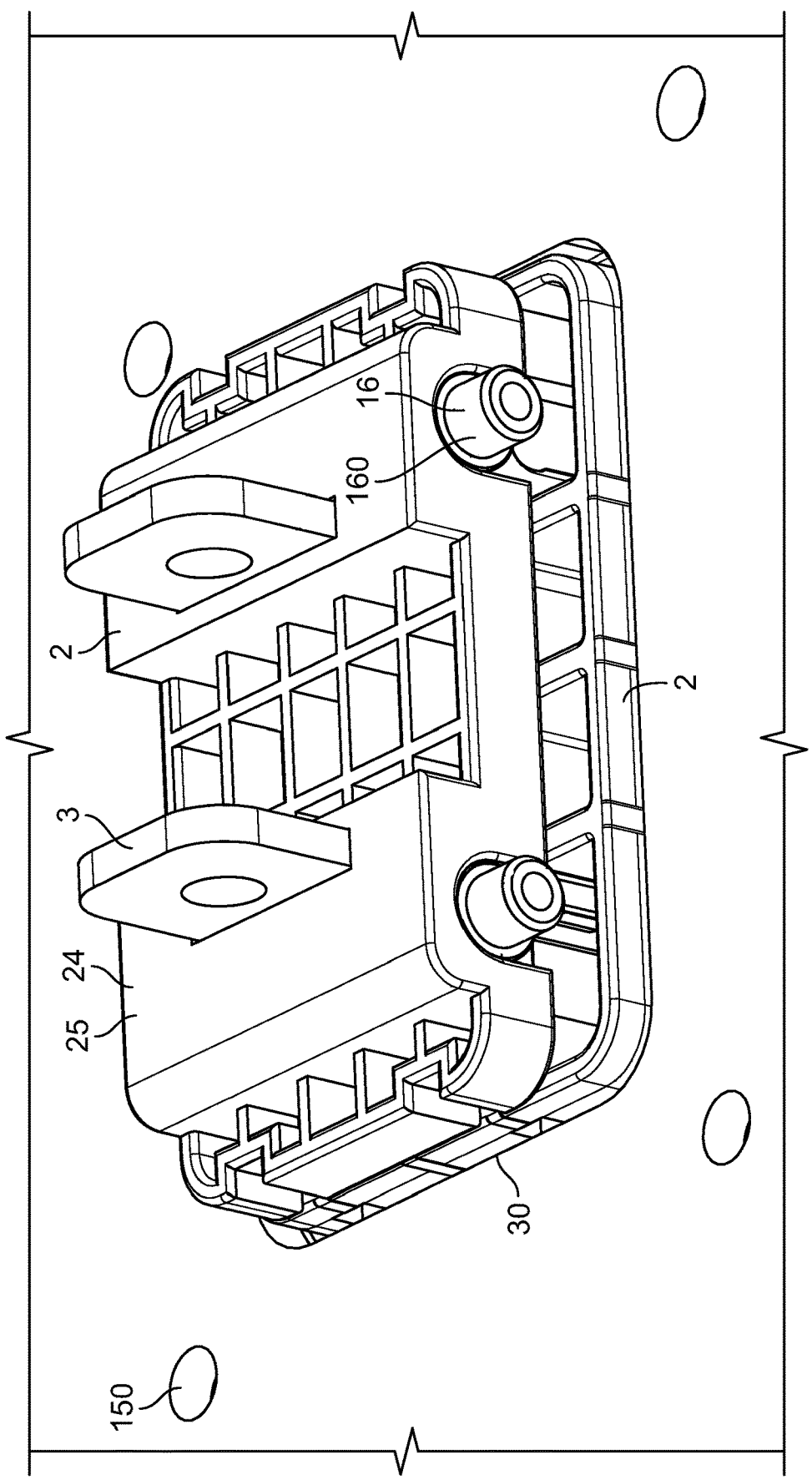
FIG. 9 is a bottom perspective view of the electrical connector of FIG. 7.

An electrical connector 1 according to another embodiment is shown in FIGS. 7-9. Like reference numbers refer to like elements. The connector 1 of the second embodiment comprises contacts 3 which are thermally bonded to heat bridges 4 via heat absorption surfaces 5. The heat bridges 4 again serve to receive the heat which is present in the contacts 3 and to pass on the heat via heat transfer surfaces 6. In order to ensure an electrical insulation, each of the heat bridges 4 in the second embodiment again possess an electrically insulating layer 7 which electrically insulates the heat bridge 4 from the contact 3, in particular in the region of the heat absorption surface 5. As in the first embodiment, the heat bridge 4 can again be part 12 of an extruded profile in order to allow simple production.

In the second embodiment, the heat transfer surfaces 6 are inner surfaces 13 of a cylinder or tube 14. The transferred heat can, for example, then be dissipated with a water cooler 16 or by a heat pipe 17. In either the water cooler 16 or the heat pipe 17, a medium flows along a circuit, absorbing and removing the heat. The heat transfer surfaces 6 are either the inner surfaces 13 of a channel for the medium flowing through, or serve as receptacles 15, for example, for a tube of a water cooler 16. In an embodiment, in order to enable as long an interaction as possible between the coolant and the heat transfer surface 6 and thus increase performance, a receptacle 15 in the heat bridge 4 can run through the heat bridge 4 in a shape which deviates from a straight shape. For example, the receptacle 15 can run in a zigzag or meandering manner. In another embodiment, in order to achieve a heat transfer surface 6 which is as large as possible with a receptacle 15 which has a small volume, the receptacle 15 can have a cavity, the measurement thereof being much smaller in one dimension than the measurements in the two other dimensions. Such a flat configuration of the receptacle 15 can also be particularly space-saving.

In the second embodiment shown in FIGS. 7-9, the water cooler 16 has terminal elements 160 which are attached to the ends of the cylindrical receptacles 15A and serve for coupling to the cooling system. In an embodiment, several receptacles 15A from several heat bridges 4 from various contacts 3 can be connected to one another, such that they can be cooled with a single cooling system. As shown in FIG. 9, a housing part 24 serves as a holding element 25 for the heat bridges 4 and the terminal elements 160.

Figure 10:
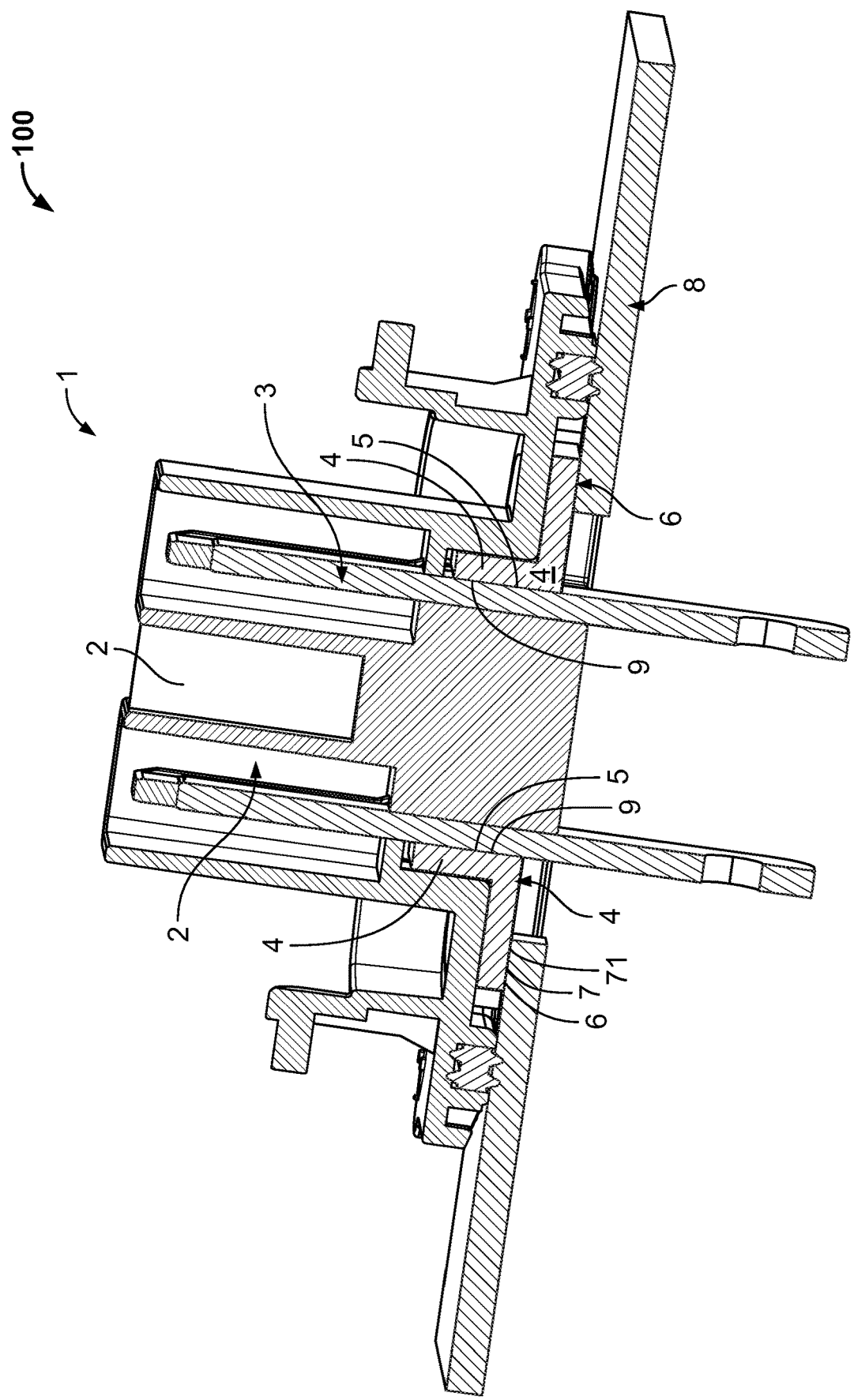
FIG. 10 is a sectional view of an electrical connector according to a third embodiment.
Figure 11:
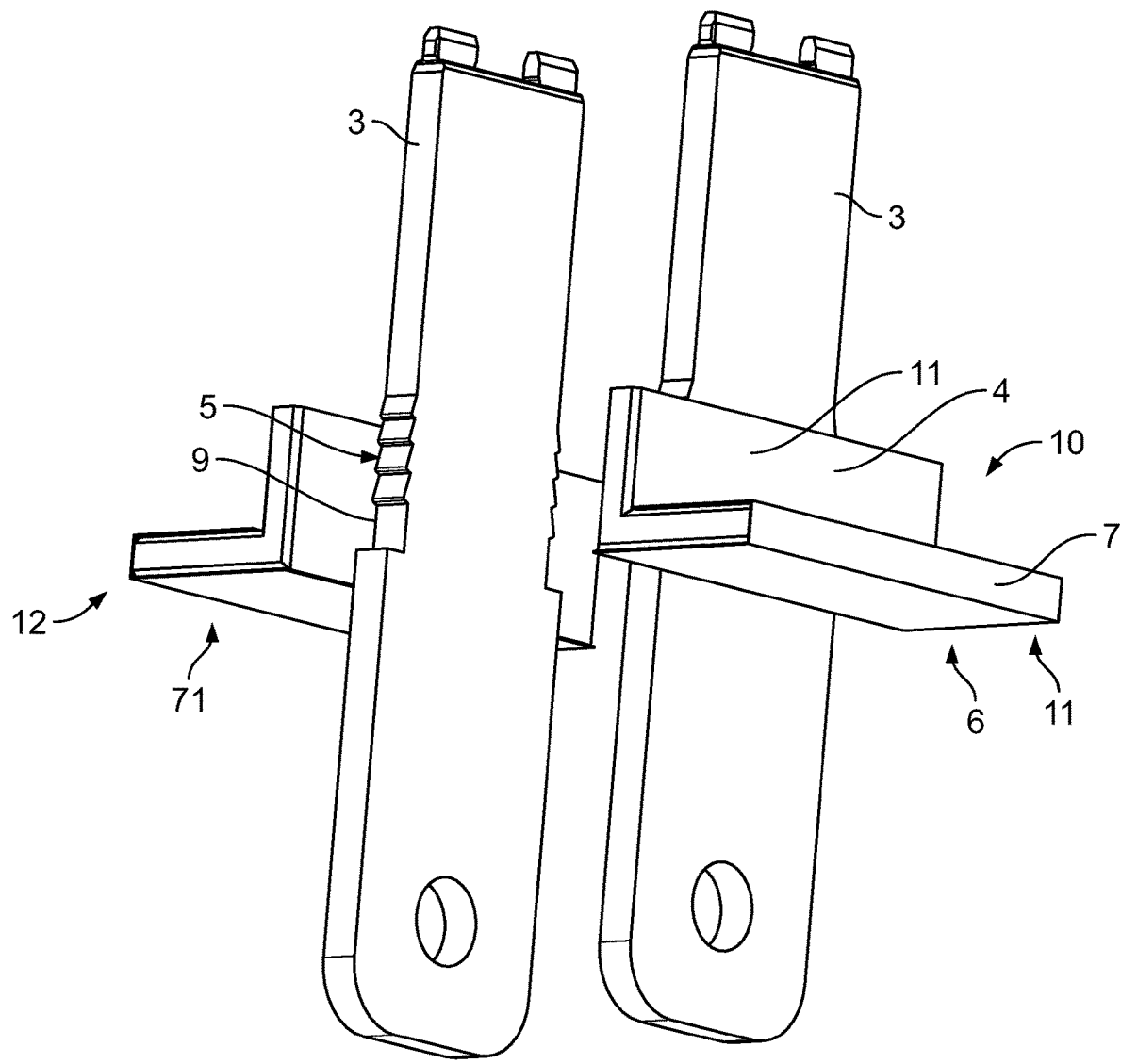
FIG. 11 is a perspective view of a heat bridge and contacts of the electrical connector of FIG. 10.
Figure 12:
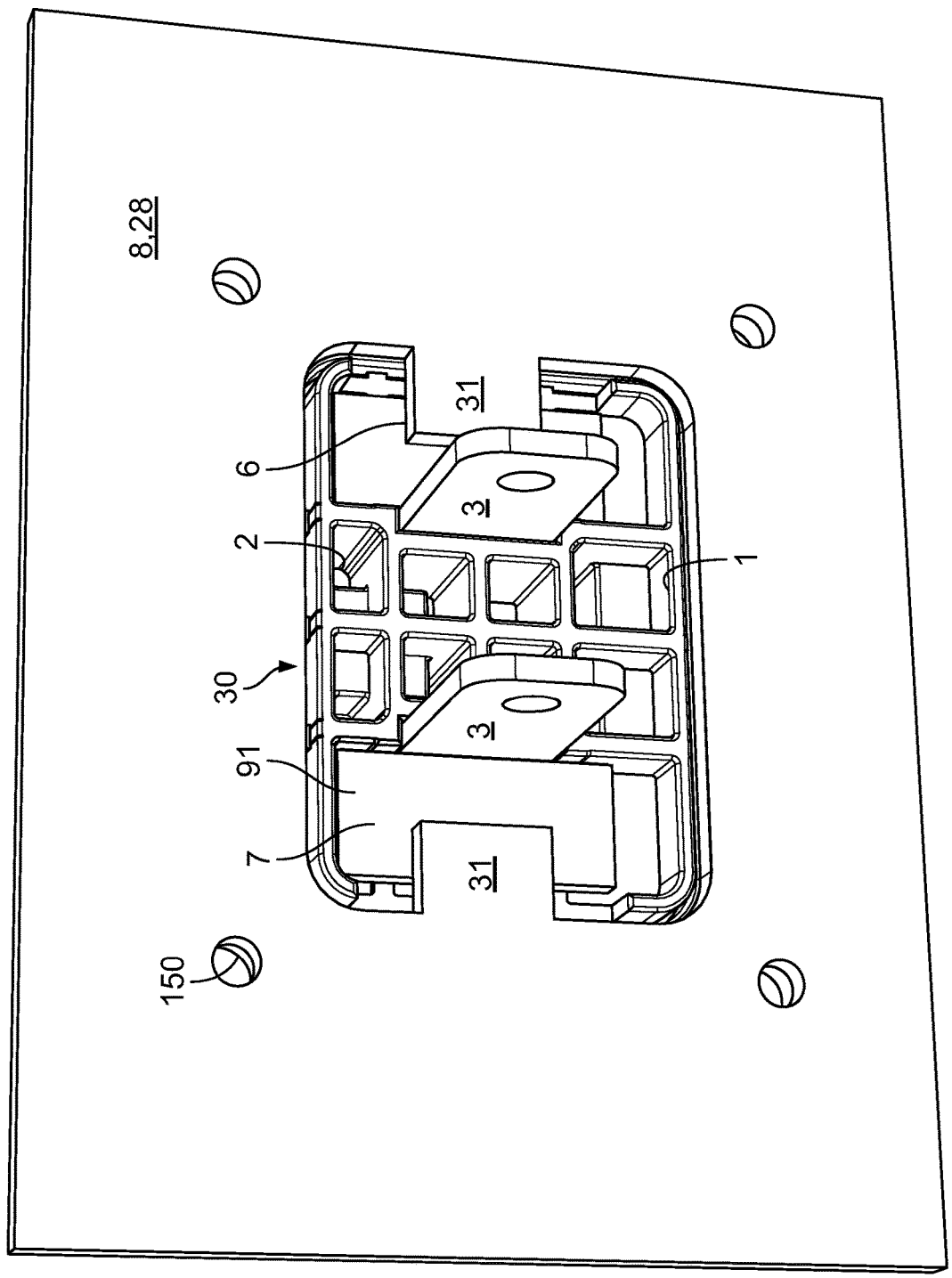
FIG. 12 is a bottom perspective view of the electrical connector of FIG. 10.

An electrical connector 1 according to a third embodiment is shown in FIGS. 10-12. The electrical connector 1 has heat bridges 4 with an L-shape 10. However, in contrast to the first embodiment, the heat bridges 4 of the third embodiment are connected to the contacts 3 via welding connections 9 in order to ensure a high degree of stability and a good heat transfer. Since a good electrical connection is present in the region of the heat absorption surface 5, the necessary electrical insulation is in this case attained in that an electrically insulating layer 7 is present in the region of the heat transfer surface 6. In order to again improve the transfer to the heat sink 8 in the form of the unit housing 28, contact tongues 31 project into the receptacle 30. Such contact tongues 31 are not necessary in the second embodiment.

Figure 14A:
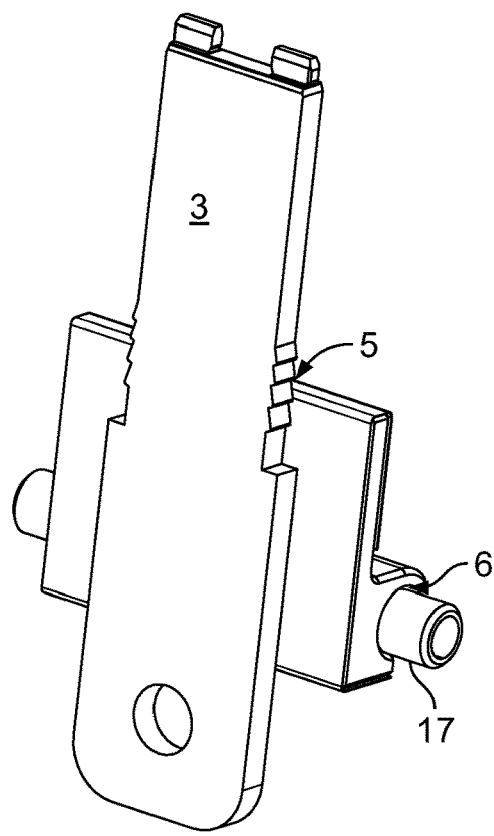
FIG. 14A is a front perspective view of a heat sink and a contact of the electrical connector of FIG. 13.
Figure 14B:
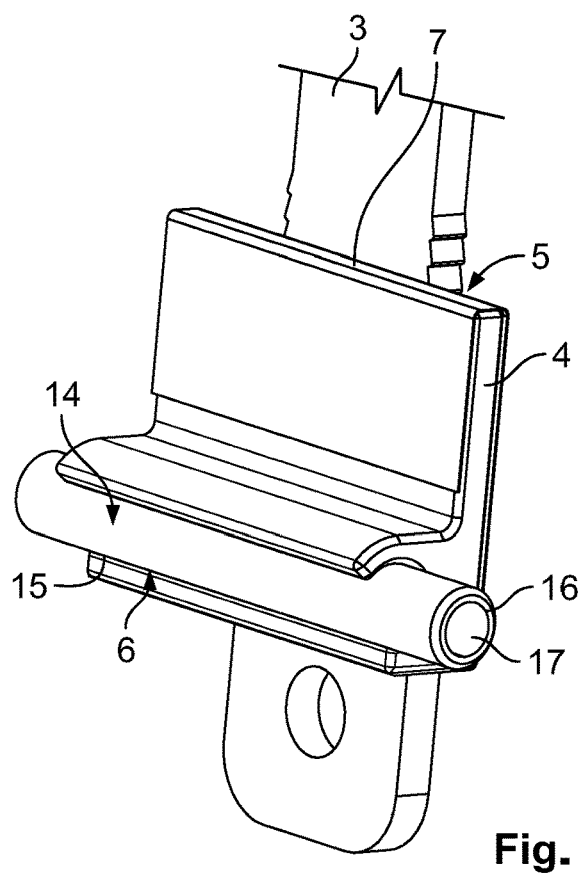
FIG. 14B is a rear perspective view of the heat sink and the contact of the electrical connector of FIG. 13.
Figure 15:
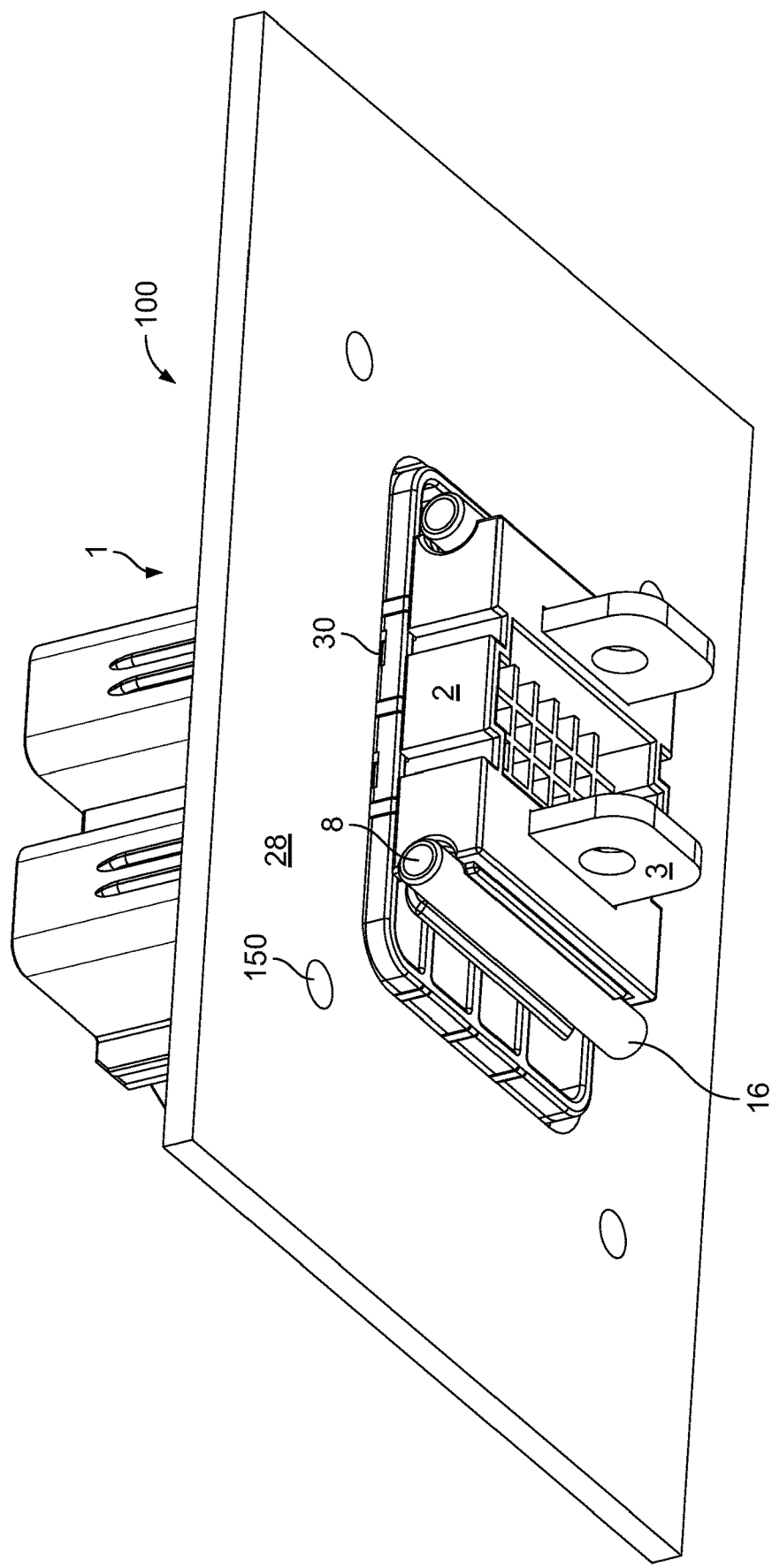
FIG. 15 is a bottom perspective view of the electrical connector of FIG. 13.

An electrical connector 1 according to a fourth embodiment is shown in FIGS. 13-15. The electrical connector 1 of the fourth embodiment is similar to the second embodiment; like reference numbers indicate like elements. In the fourth embodiment, the generated heat can be dissipated by active cooling, for example by a water cooler 16 or by a heat pipe 17. Each heat bridge 4 has partially cylindrical receptacles 15 to which a corresponding tube 14 can be attached. The heat transfer surfaces 6 are in direct contact with such a tube 14, such that it can be considered to be a heat sink 8. The receptacle 15 is, for instance, C-shaped or U-shaped and is open to one side, such that if there is a corresponding elasticity, the tube 14 can be laterally removed or introduced. The necessary electrical insulation is created by a foil 71 which is arranged in the region of the heat absorption surface 5 and also prevents an electrical flashover along an air or creepage distance.

Figure 16:
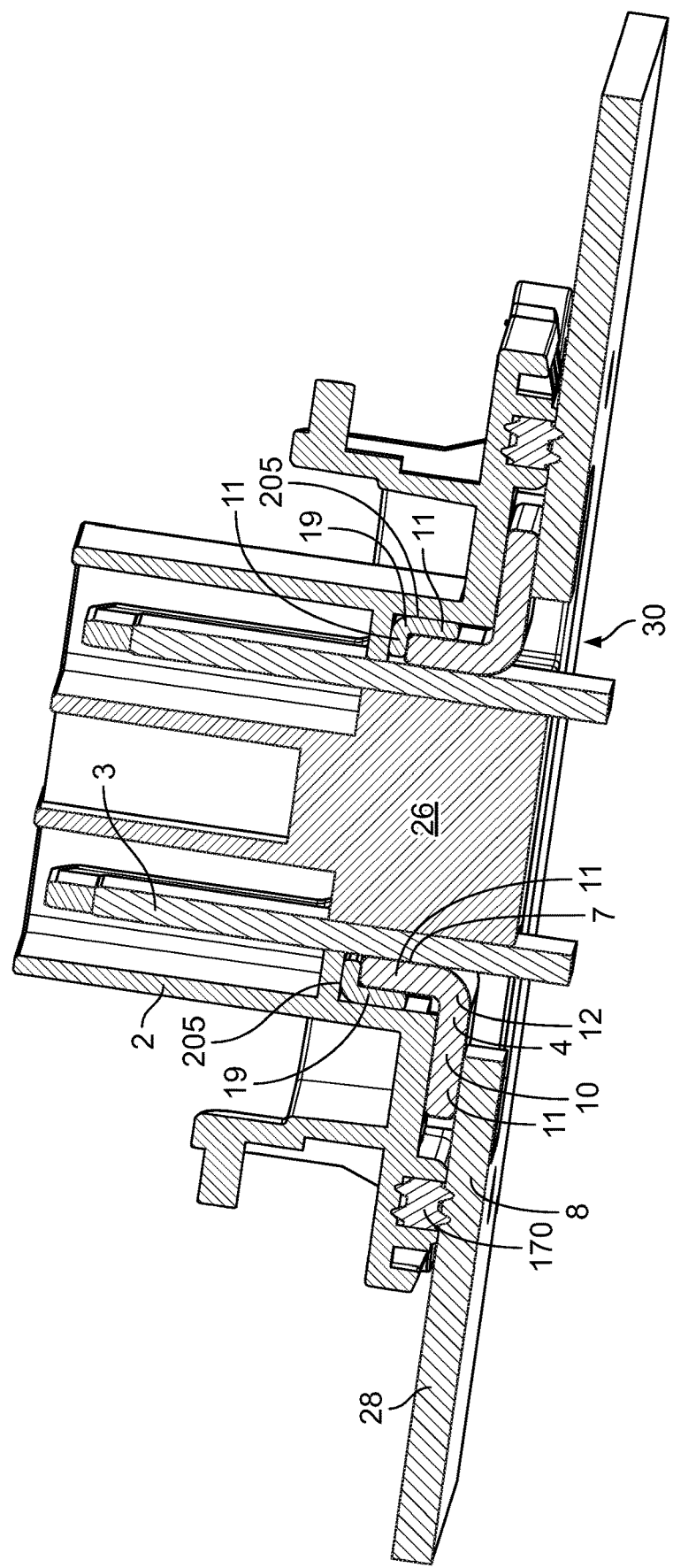
FIG. 16 is a sectional view of an electrical connector according to a fifth embodiment.
Figure 17A:
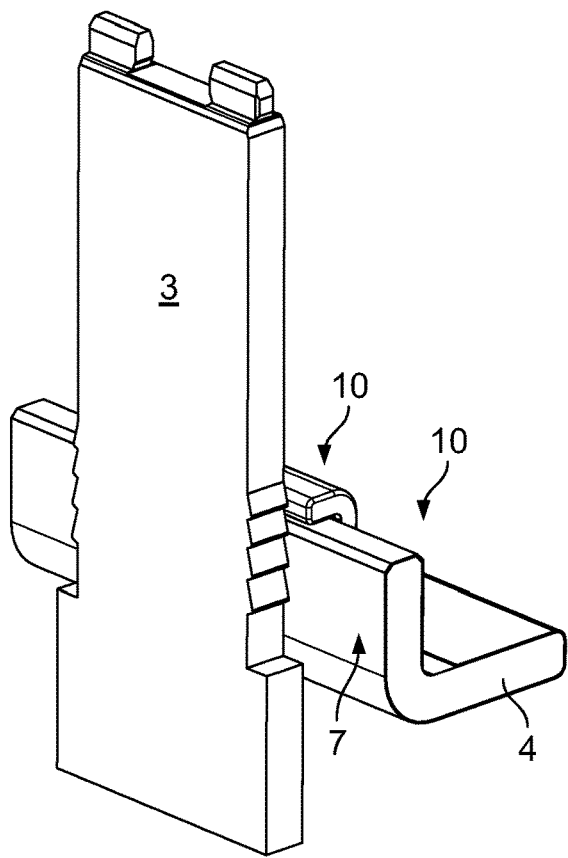
FIG. 17A is a front perspective view of a heat sink and a contact of the electrical connector of FIG. 16.
Figure 17B:
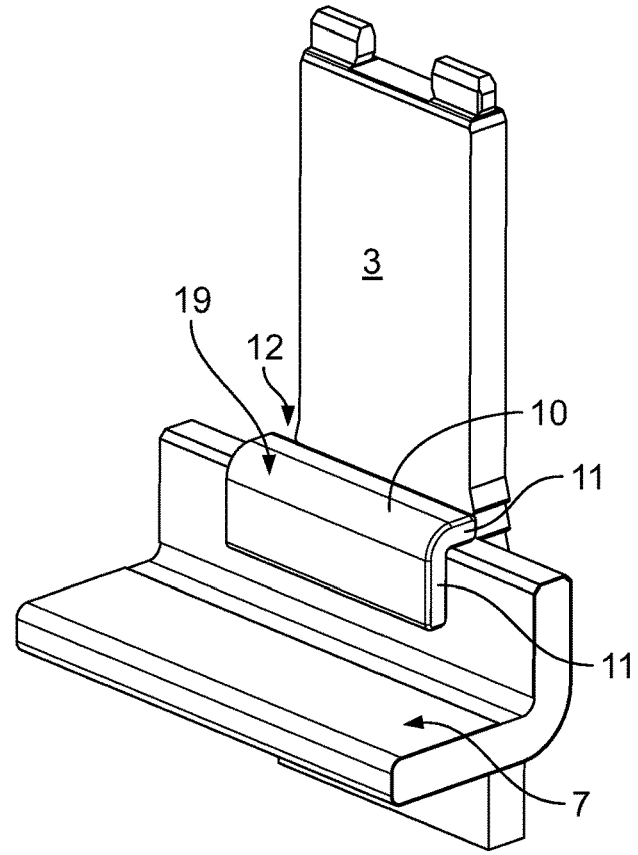
FIG. 17B is a rear perspective view of the heat sink and the contact of the electrical connector of FIG. 16.

In an electrical connector 1 according to a fifth embodiment shown in FIGS. 16, 17A and 17B, an abrasion protection 19 is present between the electrically insulating layer 7 on the heat bridge 4 and the housing 2. The abrasion protection 19 protects the electrically insulating layer 7 from a mechanical abrasion by the housing 2 inner side upon introduction into the housing 2. The abrasion protection 19 is applied to the heat bridge 4, as shown in FIGS. 17A and 17B, before both, together with the contact 3, are introduced into the housing 2. The abrasion protection 19 is complementary to the heat bridge 4 on one side, in particular complementary to a limb 11 of the heat bridge 4, and complementary to a receptacle 205 of the housing 2 on the other side. The abrasion protection 19 has an L-shape 10 with two limbs 11 and can in particular be part 12 of an extruded profile for ease of production. In an embodiment, the abrasion protection 19 is formed from an electrically insulating material or can be prevented from contacting voltage-carrying components through an appropriate formation.

A sixth embodiment of the electrical connector 1 shown in FIGS. 18 and 19 has a pressing element 20 disposed between the housing 2 and the heat bridge 4. The pressing element 20 is formed of an elastic material. In the assembled state, the wedge-shaped pressing element 20, 21 generates a contact pressure between the heat bridge 4 and the contact 3, in particular in the region of the heat absorption surface 5. The contact 3 is supported on the other side on a base 26 of the housing 2. The thermal transfer between the contact 3 and the heat bridge 4 can be improved by the high pressure created by the pressing element 20. As in other embodiments, a contact pressure between the heat bridge 4 and the heat sink 8 is attained in the region of the heat transfer surface 6 by screwing the connector 1 onto the heat sink 8.

Figure 20:
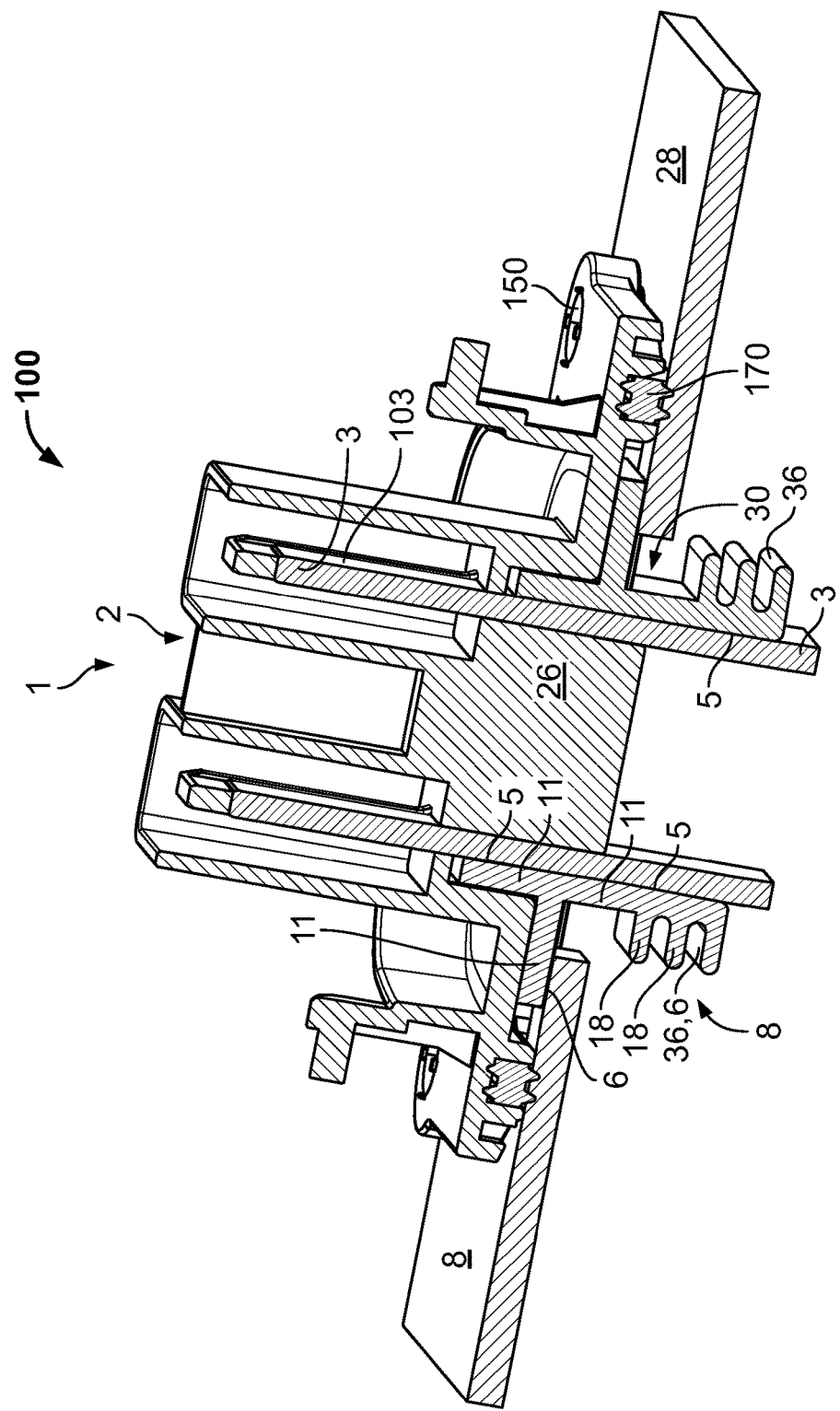
FIG. 20 is a sectional view of an electrical connector according to a seventh embodiment.
Figure 21A:
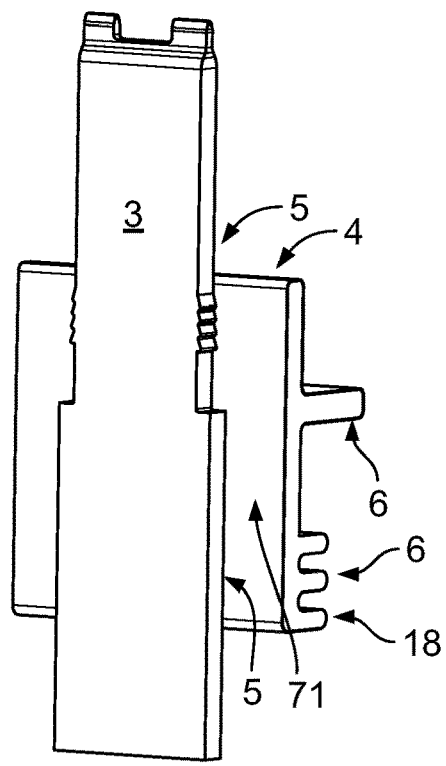
FIG. 21A is a front perspective view of a heat sink and a contact of the electrical connector of FIG. 20.
Figure 21B:
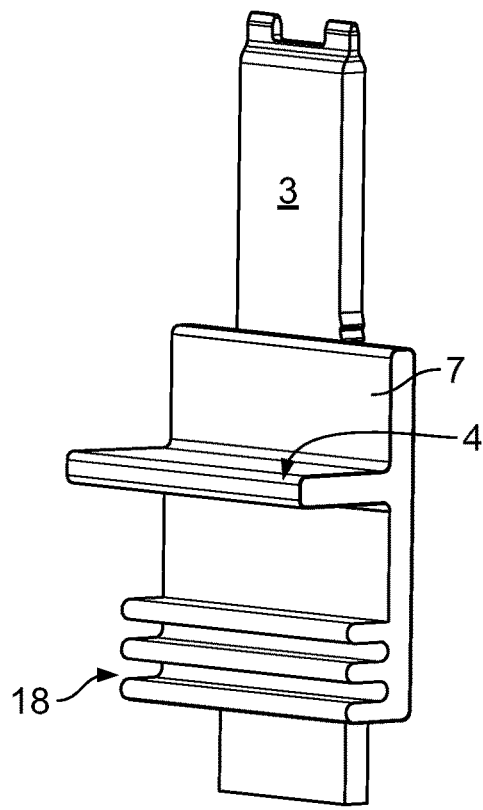
FIG. 21B is a rear perspective view of the heat sink and the contact of the electrical connector of FIG. 20.
Figure 22:
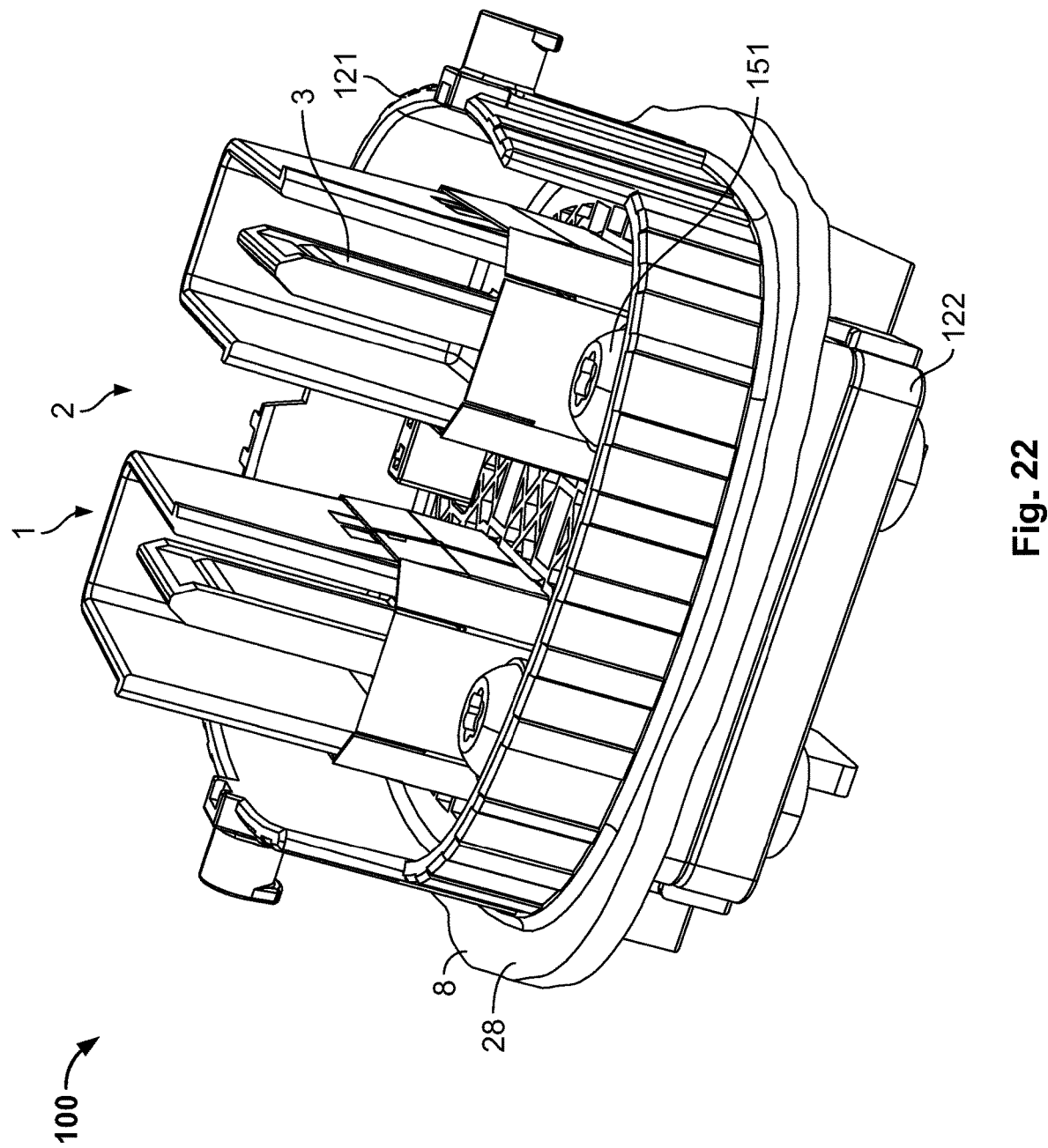
FIG. 22 is a top perspective view of an electrical connector according to an eighth embodiment.
Figure 23:
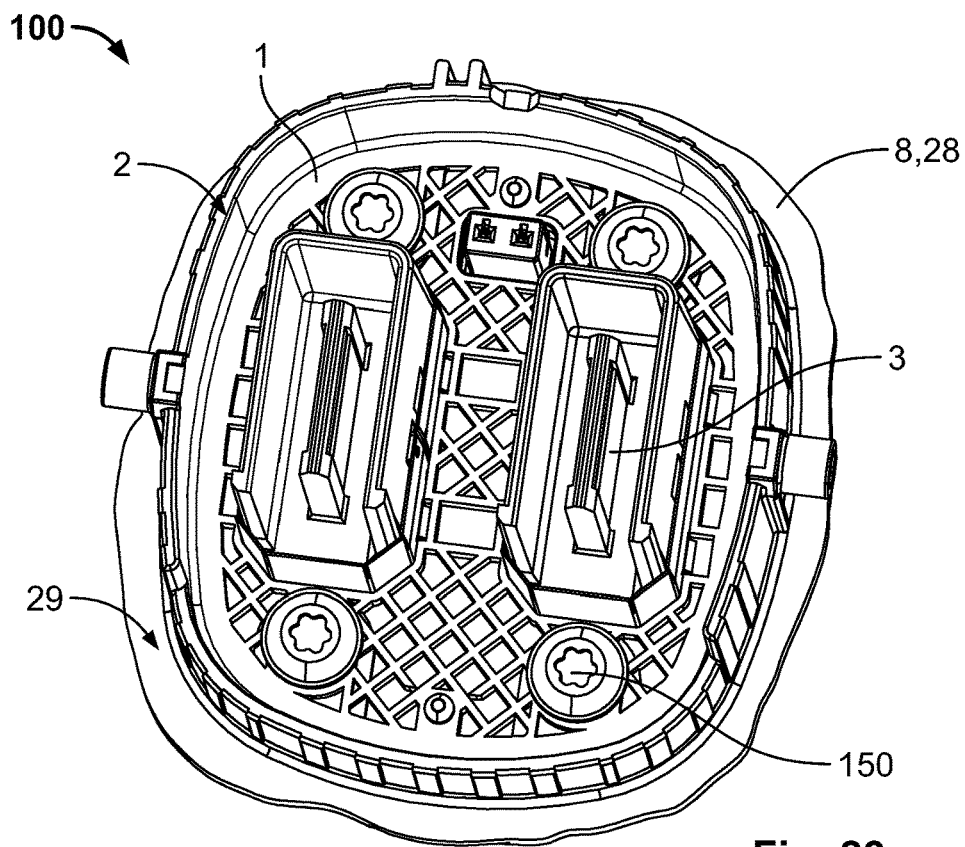
FIG. 23 is a bottom perspective view of the electrical connector of FIG. 22.
Figure 24:
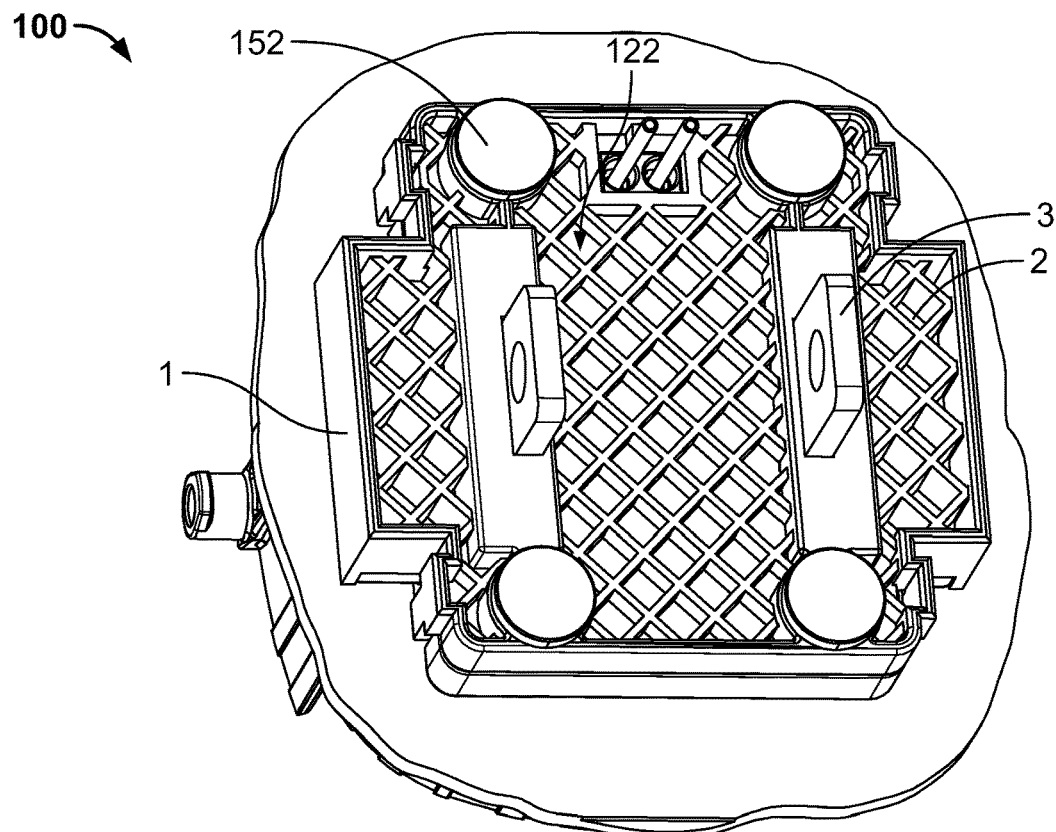
FIG. 24 is another bottom perspective view of the electrical connector of FIG. 22.
Figure 25:
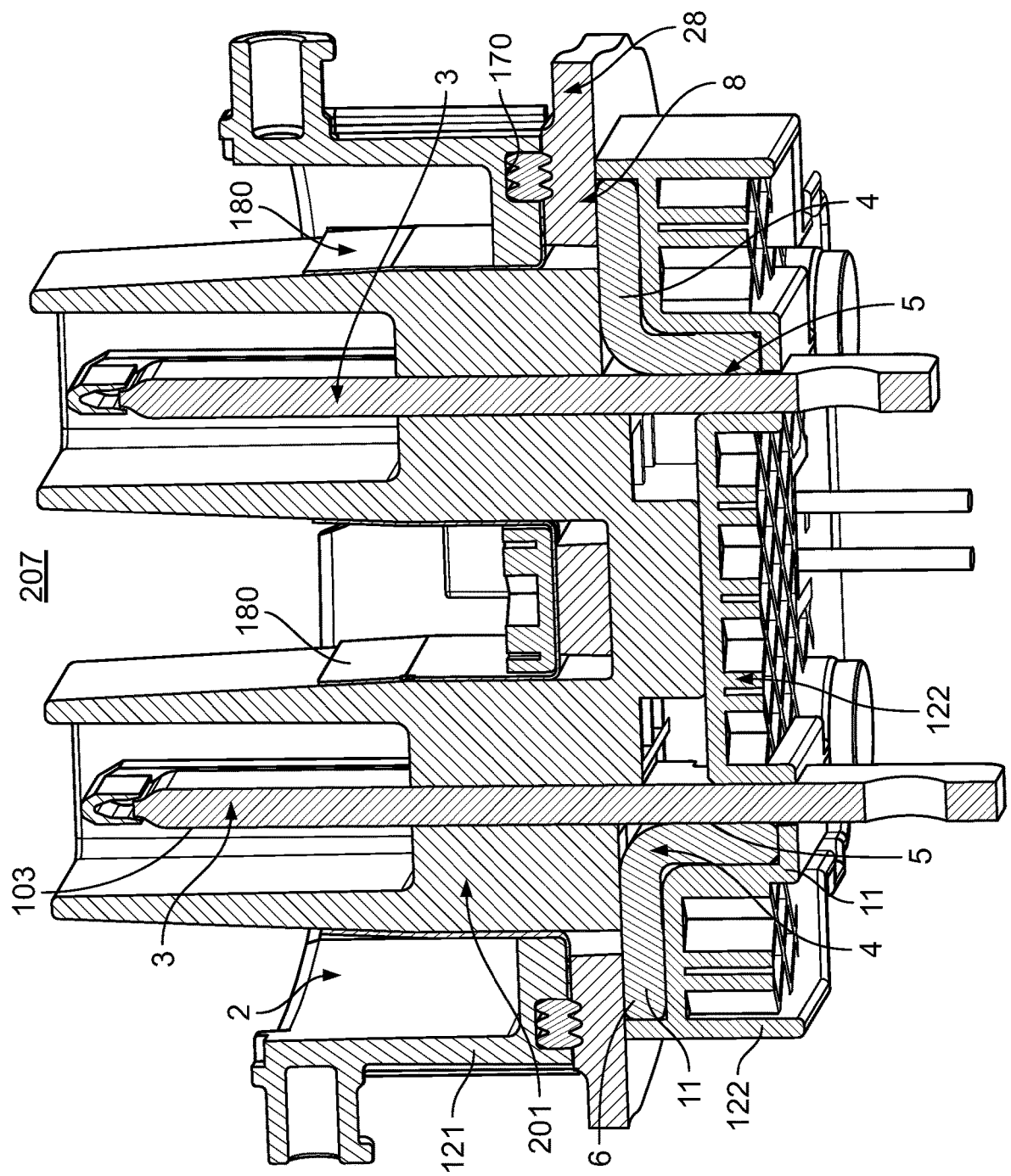
FIG. 25 is a sectional view of the electrical connector of FIG. 22.

In a seventh embodiment of the electrical connector 1 shown in FIGS. 20, 21A, and 21B, in addition to a first heat transfer surface 6, with which a connection to the heat sink 8 in the form of the unit housing 28 is produced, the heat bridge 4 has a second heat transfer surface 36 at a plurality of cooling fins 18. In this case, the environment, for example the air, serves as a heat sink 8, to which the second heat transfer surface 36 emits the heat. The cooling fins 18 supply a large surface in order to be able to transfer a correspondingly large amount of heat.

In the seven embodiments shown so far, the connector 1 is made up of one part and is inserted into the unit housing 28 from one side. In the following embodiments, the connector 1 is in each case made up of two parts, a first part 121 arranged on a first side of the unit housing 28, for example an outer side, and a second part 122 being arranged on a second side of the unit housing 28, for example an inner side. Both the first part 121 and the second part 122 can, for instance, be pressed together by screws 151 and have cooperating mating contacts 152 with internal threads. The unit housing 28 is at least partially pressed between the first part 121 and the second part 122. The exemplary embodiments depicted hereinafter are similar to the exemplary embodiments already shown, but are adapted to the two-part embodiment.

A two-part connector 1 according to an eighth embodiment is shown in FIGS. 22-25. In the eighth embodiment, an electrically insulating layer 7, as in the first embodiment, is present both in the region of a heat absorption surface 5 and also in the region of the heat transfer surface 6 on the heat bridge 4. In contrast to the first embodiment, a second limb 11 of the L-shaped heat bridge 4 here faces away from a plug-in side 207 on which the plug 1 is plugged together with a mating plug. A shielding 180 is also shown, with which an electromagnetic shielding is achieved.

Figure 26:
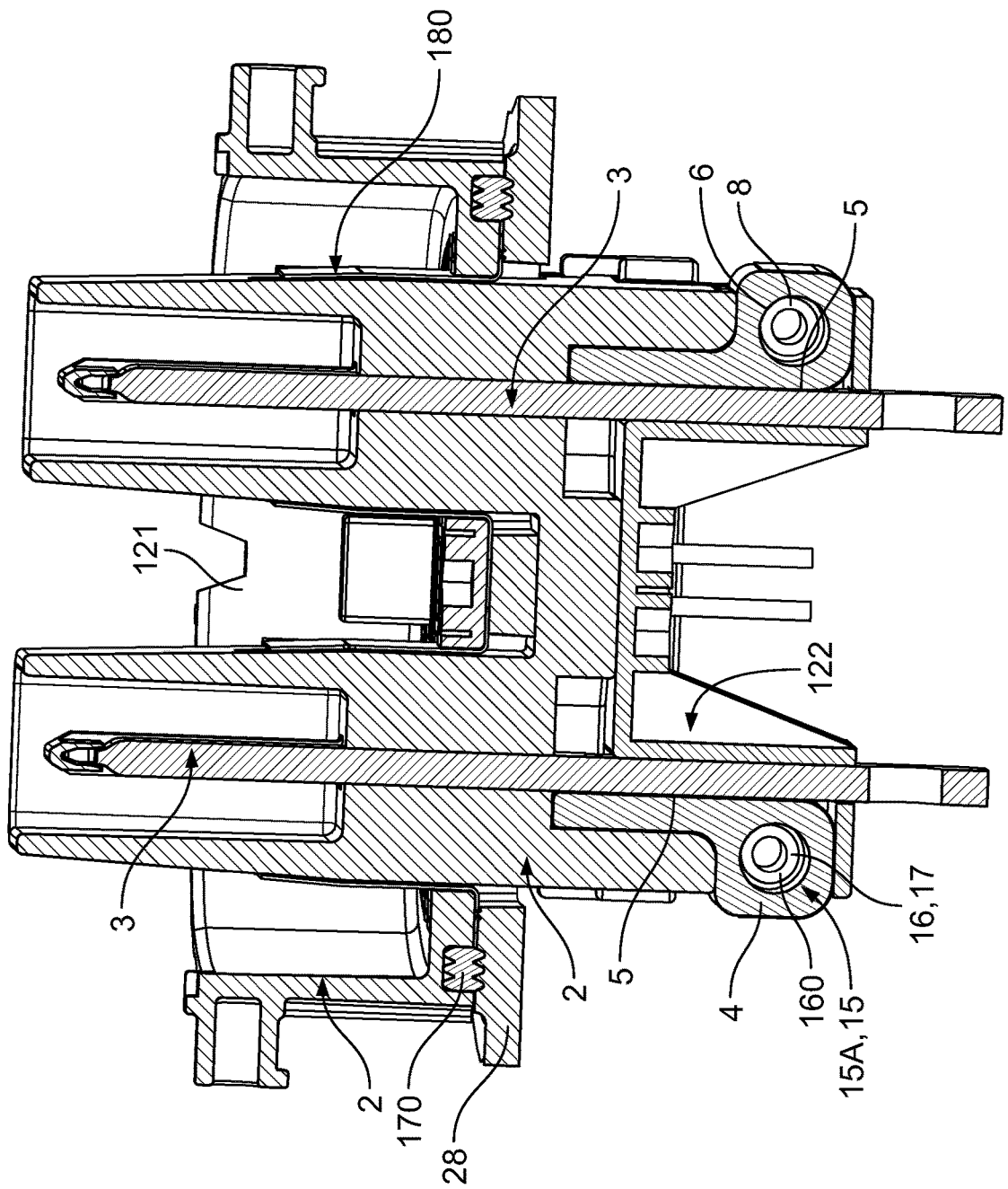
FIG. 26 is a sectional view of an electrical connector according to a ninth embodiment.

A two-part connector 1 according to a ninth embodiment is shown in FIG. 26 and is similar to the connector 1 of the second embodiment. The two-part connector 1 of the ninth embodiment can be used with a water cooler 16 or a heat pipe 17 for actively cooling and/or with a medium flowing through.

Figure 27:
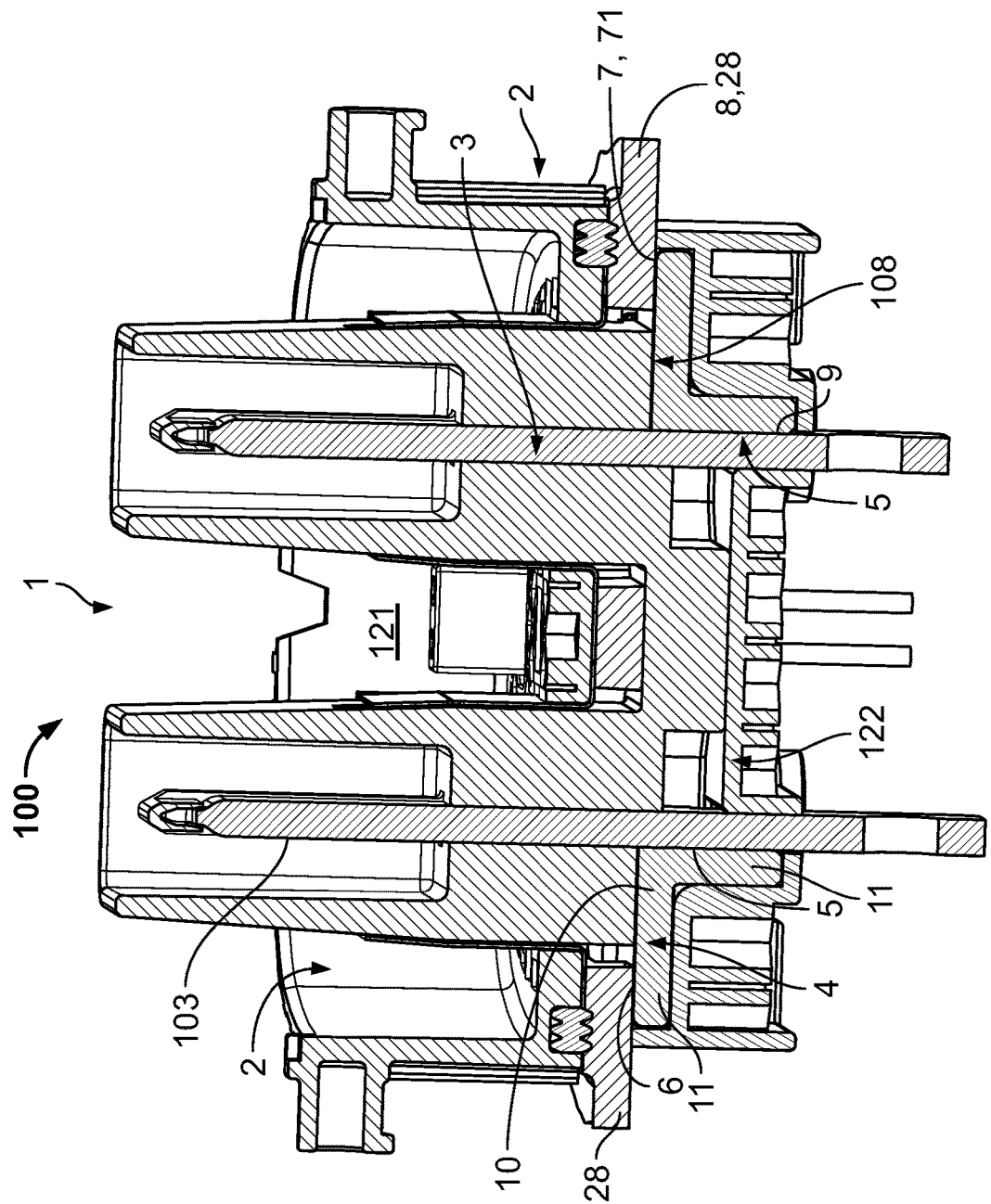
FIG. 27 is a sectional view of an electrical connector according to a tenth embodiment.

A two-part connector 1 according to a tenth embodiment is shown in FIG. 27 and is similar to the connector of the third embodiment. The two-part connector 1 of the tenth embodiment has a welding connection 9 between the contact 3 and the heat bridge 4. The necessary electrical insulation is achieved by a foil 71 arranged in the region of the heat transfer surface 6 on which the heat bridge 4 is attached to the heat sink 8 in the form of the unit housing 28.

Figure 28:
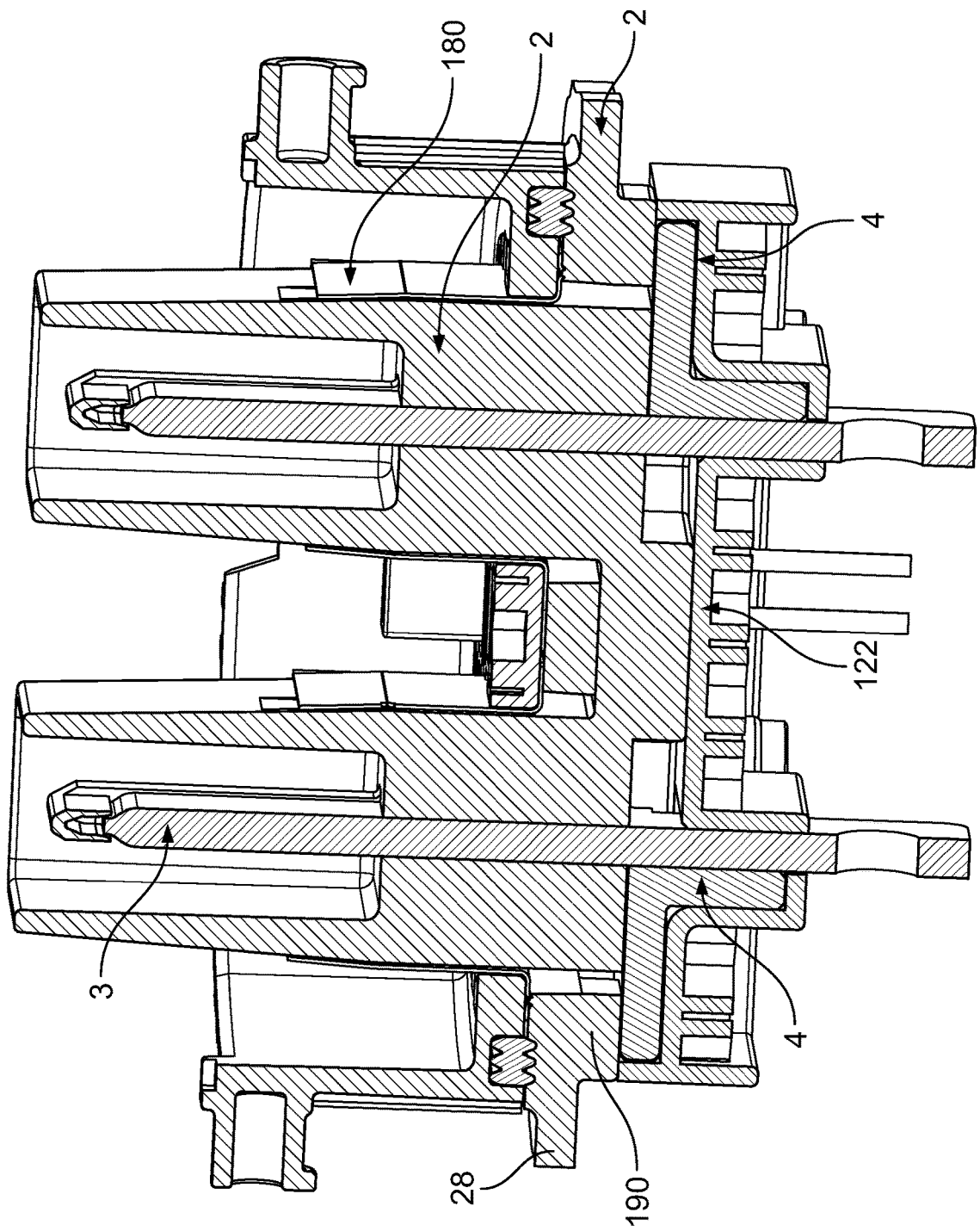
FIG. 28 is a sectional view of an electrical connector according to an eleventh embodiment.

A two-part connector 1 according to an eleventh embodiment is shown in FIG. 28 and is similar to the tenth embodiment, but differs in that an additional step 190 is present on the unit housing 28 which spaces the first part 121 and second part 122 to enable air cooling. In the tenth embodiment, an air circulation can be enabled, for instance by recesses (cut-outs) in the unit housing 28.

Figure 29:
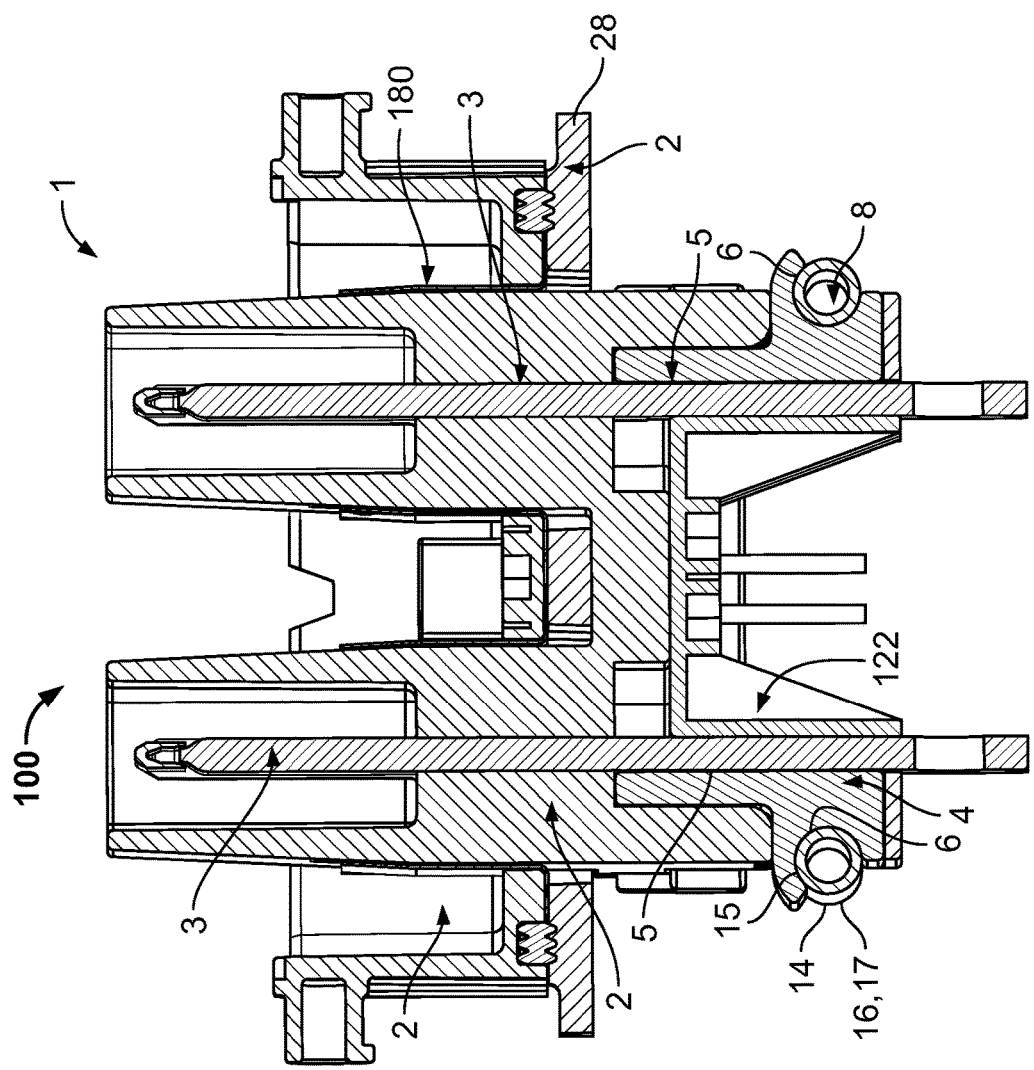
FIG. 29 is a sectional view of an electrical connector according to a twelfth embodiment.

In a twelfth embodiment shown in FIG. 29, a two-part connector 1 has a partially closed, partially open receptacle 15 for a tube 14, on which an active cooling can take place with a water cooler 16 or cooling by a heat pipe 17.

Figure 30:
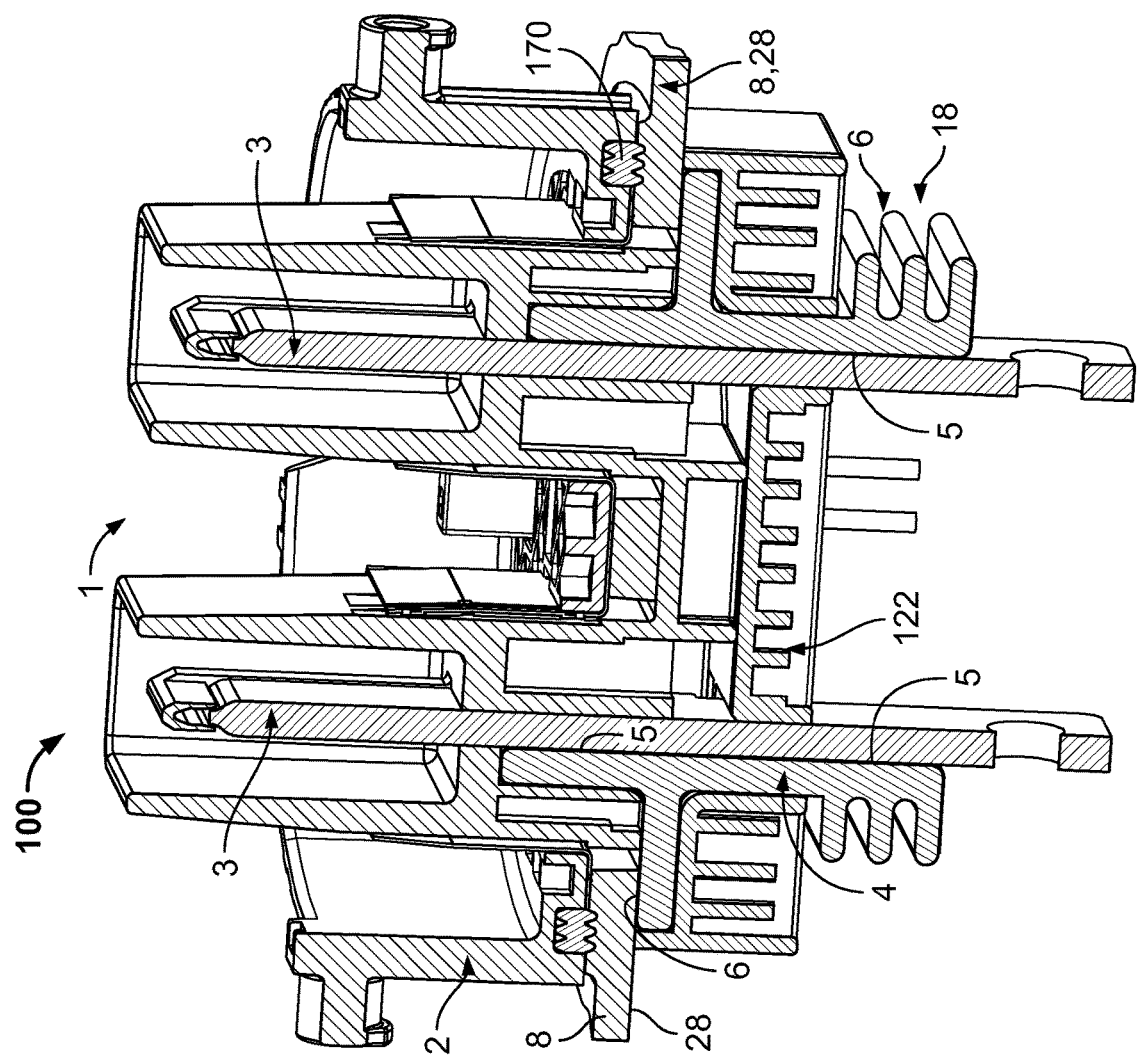
FIG. 30 is a sectional view of an electrical connector according to a thirteenth embodiment.

In a thirteenth embodiment shown in FIG. 30, similarly to the seventh embodiment, the two-part connector 1 has a plurality of cooling fins 18 which supply an additional heat transfer surface 6 for air-cooling.

Figure 19A:
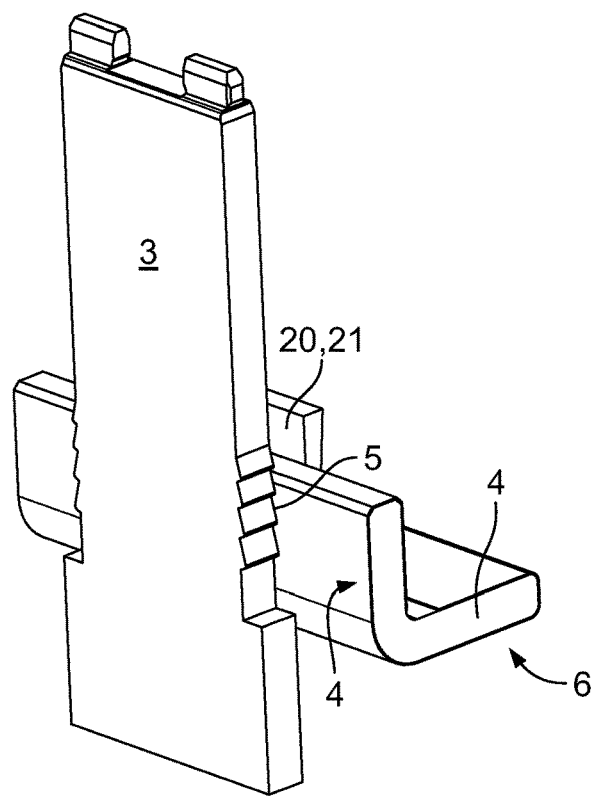
FIG. 19A is a front perspective view of a heat sink and a contact of the electrical connector of FIG. 18.
Figure 19B:
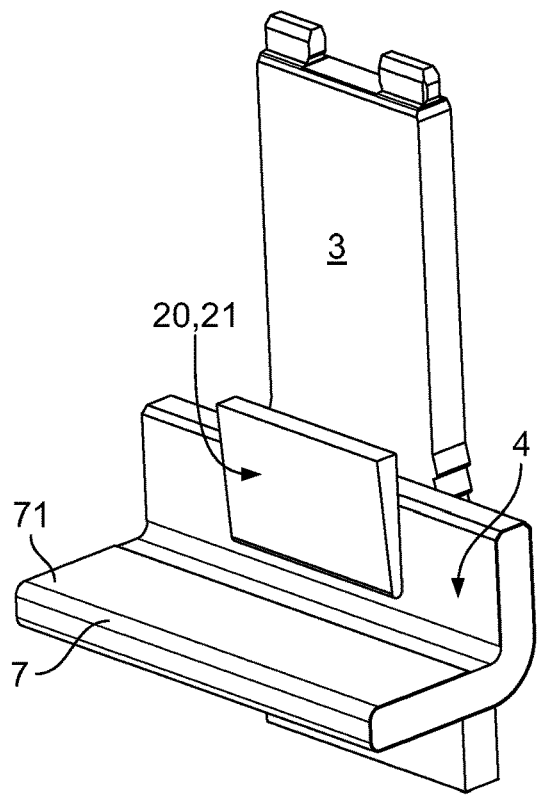
FIG. 19B is a rear perspective view of the heat sink and the contact of the electrical connector of FIG. 18.
Figure 31:
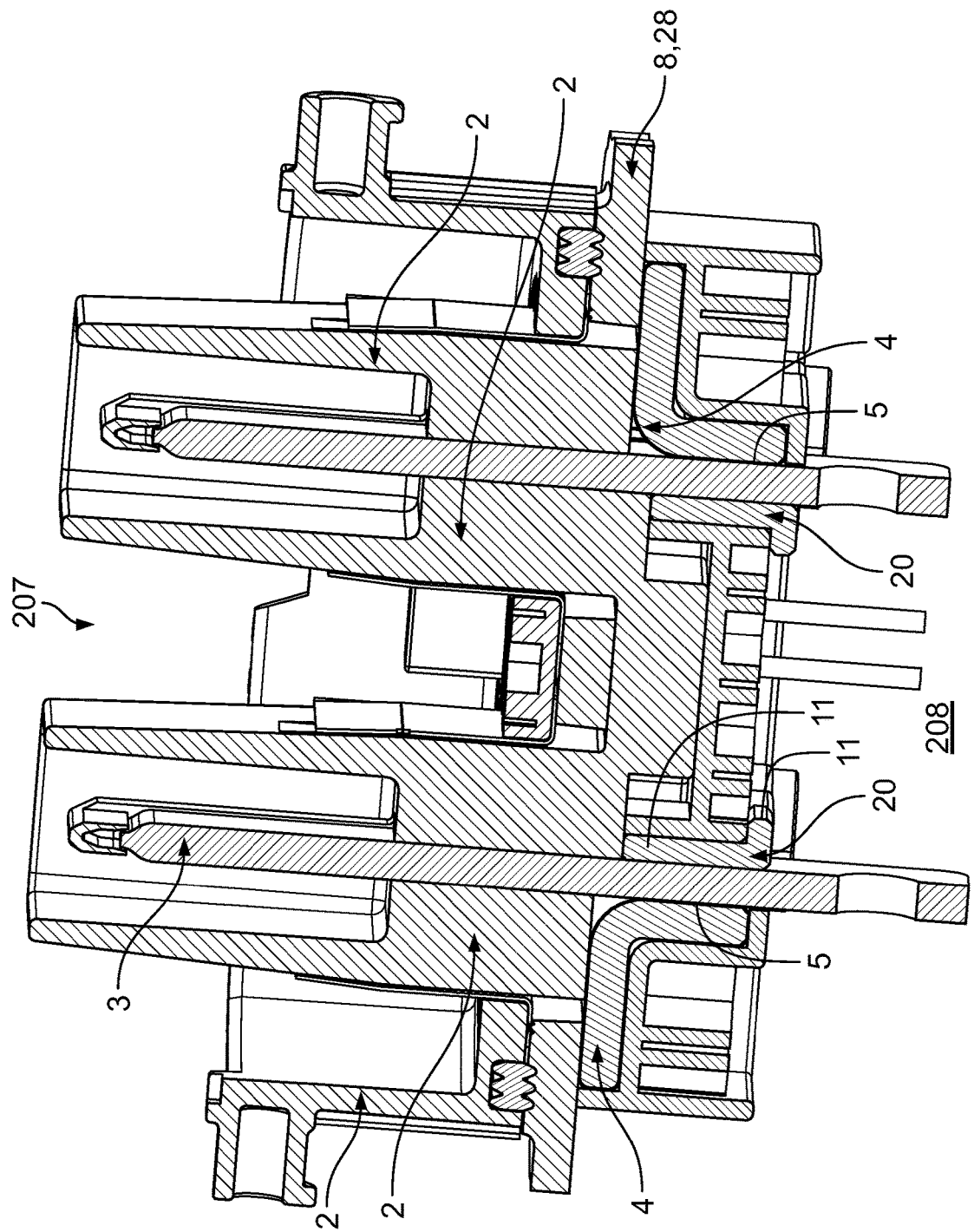
FIG. 31 is a sectional view of an electrical connector according to an fourteenth embodiment.
Figure 32B:
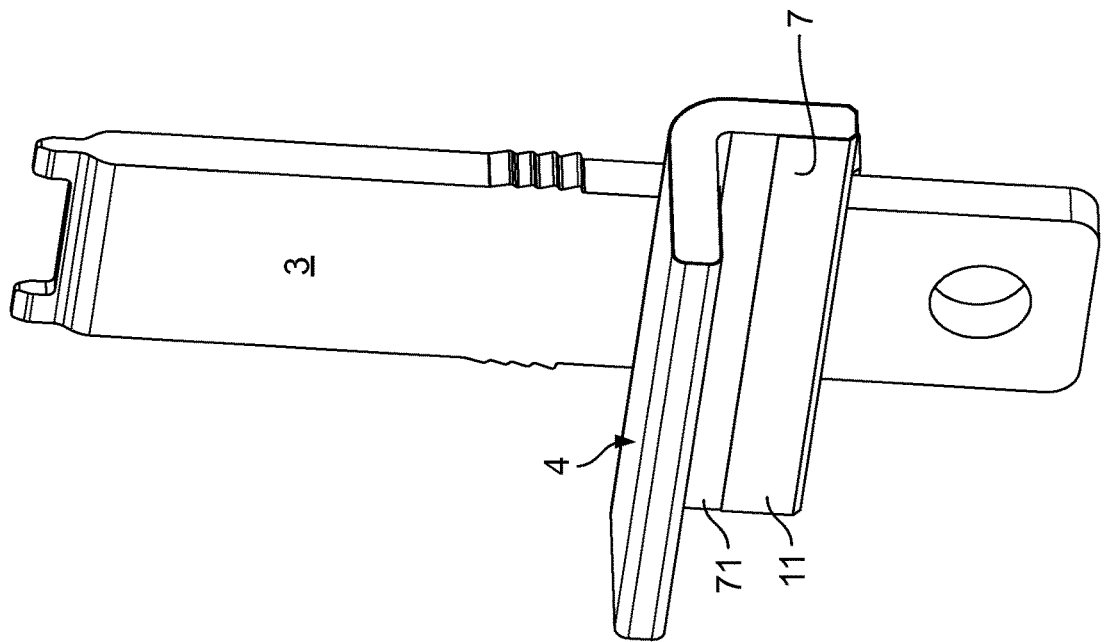
FIG. 32B is a rear perspective view of the heat sink and the contact of the electrical connector of FIG. 31.
Figure 32A:
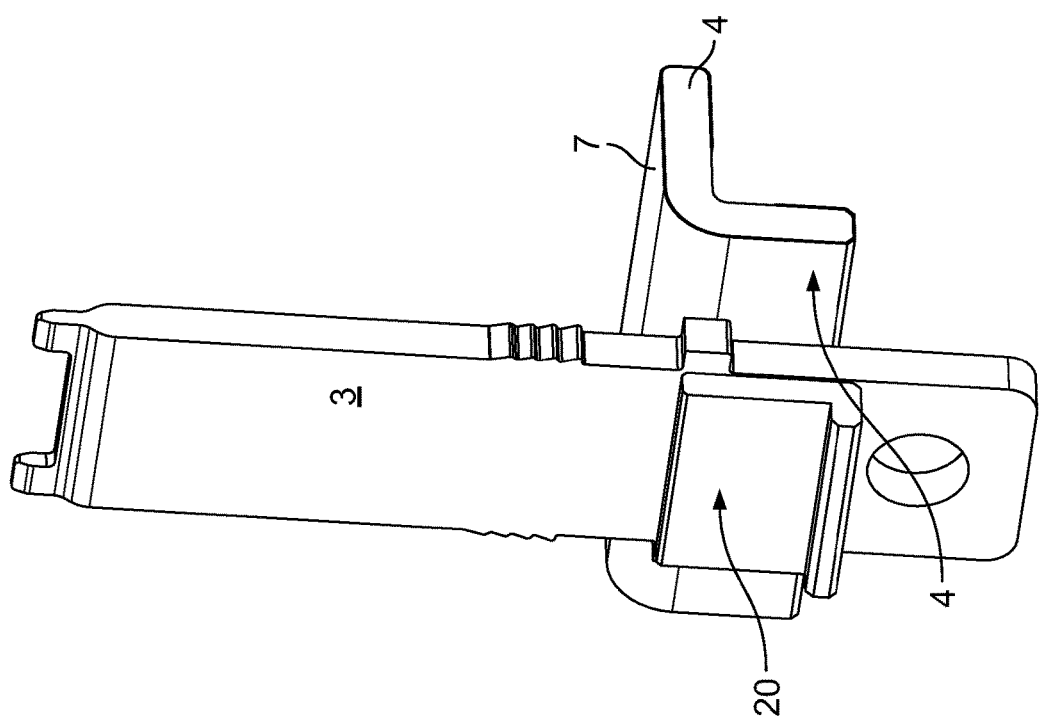
FIG. 32A is a front perspective view of a heat sink and a contact of the electrical connector of FIG. 31.

In a fourteenth embodiment shown in FIGS. 31, 32A and 32B, the two-part connector 1 has a pressing element 20 similar to the sixth embodiment which generates a good thermal contact between the contact 3 and the heat bridge 4. In contrast to the sixth embodiment, the pressing element 20 is inserted into the connector 1 from an underside 208, the underside 208 being located opposite the plug-in side 207. For easier removal, the pressing element 20 also has an L-shape abutting the contact 3 with one limb 11 and being able to be levered out at the other limb 11 by, for example, a screwdriver. A further difference to the sixth embodiment shown in FIGS. 18, 19A and 19B is that the pressing element 20 abuts against the contact 3, as a result of which damage to the heat bridge 4 and in particular to an electrically insulating layer 7 is prevented.

The connector 1 in each of the embodiments penetrates the unit housing surface 29 in both the one-part and in the two-part embodiments shown, such that complex feedthroughs in the region of the unit housing surface 29 can be dispensed with.

The depicted embodiments only show planar contacts 3 with a rectangular cross-section. In a corresponding configuration of the heat absorption surface 5, other cross-sectional shapes are also possible, for example, square or round cross-sections. In the case of a round cross-section, the heat absorption surface 5 can be configured correspondingly complementarily in order to achieve a good heat transfer. A configuration in which the contact 3 only has a planar side at the location at which the receiving surface is applied, and otherwise has a round cross-section, is also possible.

The heat bridge 4 can also have various configurations. Alternatively to the shown embodiments with a rectangular cross-section, the heat bridge 4 can have, for example, a cross-section which is triangular, square or differently shaped. In further embodiments, a 3D contour can also be present.

In each of the embodiments of the connector 1, heat which is generated by the power transmission in the contact 3 can be dissipated. As a result, more power can be sent through the contact 3 or smaller contacts and thus smaller connectors 1 can be used to transmit a given power.

What is claimed is:

1. An electrical connector, comprising:
 a housing;
 an electrical contact disposed in the housing; and
 a heat bridge having a heat absorption surface thermally connected to the electrical contact and a heat transfer surface accessible from outside the electrical connector and electrically insulated from the electrical contact, the heat bridge is connected to the electrical contact by a welding connection, the heat bridge has an additional heat transfer surface that is a plurality of cooling fins.

2. The electrical connector of claim 1, wherein the heat bridge has an electrically insulating layer on the heat absorption surface and/or the heat transfer surface.

3. The electrical connector of claim 1, wherein the heat bridge has an L-shape and the heat absorption surface and the heat transfer surface are perpendicular to one another.

4. The electrical connector of claim 1, wherein the heat bridge is a separated part of an extruded profile.

5. The electrical connector of claim 1, wherein the heat transfer surface is an inner surface of a pipe.

6. The electrical connector of claim 2, further comprising an abrasion protection disposed between the electrically insulating layer and the housing.

7. The electrical connector of claim 1, further comprising a pressing element producing a contact pressure between the electrical contact and the heat bridge.

8. An electrical assembly, comprising:
 an electrical connector including a housing, an electrical contact disposed in the housing, and a heat bridge having a heat absorption surface thermally connected to the electrical contact and a heat transfer surface accessible from outside the electrical connector and electrically insulated from the electrical contact; and
 a heat sink attached to the electrical connector to receive a heat transfer from the heat bridge, the electrical connector extends through a housing surface of the housing.

9. The electrical assembly of claim 8, wherein the heat bridge is connected to the heat sink and electrically insulated from the heat sink.

10. The electrical assembly of claim 8, wherein the heat sink is a unit housing of a vehicle.

11. The electrical assembly of claim 10, wherein the electrical connector extends through a unit housing surface of the unit housing.

12. The electrical assembly of claim 10, wherein the unit housing has a heat contact tongue projecting into a recess of the unit housing, the electrical connector received in the recess.

13. The electrical assembly of claim 12, wherein the heat contact tongue is in direct thermal contact with the heat bridge.

14. The electrical assembly of claim 13, wherein the heat contact tongue projects into the recess in a direction perpendicular to a longitudinal direction of the electrical contact.

15. An electrical connector, comprising:
 a housing;
 an electrical contact disposed in the housing;
 a heat bridge having a heat absorption surface thermally connected to the electrical contact and a heat transfer surface accessible from outside the electrical connector and electrically insulated from the electrical contact, the heat bridge has an electrically insulating layer on the heat absorption surface and/or the heat transfer surface; and
 an abrasion protection disposed between the electrically insulating layer and the housing.

16. An electrical assembly, comprising:
 an electrical connector including a housing, an electrical contact disposed in the housing, and a heat bridge having a heat absorption surface thermally connected to the electrical contact and a heat transfer surface accessible from outside the electrical connector and electrically insulated from the electrical contact; and a heat sink attached to the electrical connector to receive a heat transfer from the heat bridge, the heat sink is a unit housing of a vehicle, the unit housing has a heat contact tongue projecting into a recess of the unit housing, the electrical connector received in the recess.

17. The electrical assembly of claim 16, wherein the heat contact tongue is in direct thermal contact with the heat bridge.

18. The electrical assembly of claim 17, wherein the heat contact tongue projects into the recess in a direction perpendicular to a longitudinal direction of the electrical contact.

19. An electrical connector, comprising:
a housing;
an electrical contact disposed in the housing; and
a heat bridge having a heat absorption surface thermally connected to the electrical contact and a heat transfer surface accessible from outside the electrical connector and electrically insulated from the electrical contact, the heat bridge is connected to the electrical contact by a welding connection, the heat bridge is a separated part of an extruded profile.

20. An electrical connector, comprising:
a housing;
an electrical contact disposed in the housing;
a heat bridge having a heat absorption surface thermally connected to the electrical contact and a heat transfer surface accessible from outside the electrical connector and electrically insulated from the electrical contact, the heat bridge is connected to the electrical contact by a welding connection; and
a pressing element producing a contact pressure between the electrical contact and the heat bridge.

* * * * *